US009935240B2

(12) United States Patent
Supran et al.

(10) Patent No.: US 9,935,240 B2
(45) Date of Patent: Apr. 3, 2018

(54) NEAR-INFRARED LIGHT EMITTING DEVICE USING SEMICONDUCTOR NANOCRYSTALS

(71) Applicants: Geoffrey J. S. Supran, Cambridge, MA (US); Katherine W. Song, Cambridge, MA (US); Gyuweon Hwang, Cambridge, MA (US); Raoul Emile Correa, West Hartford, CT (US); Yasuhiro Shirasaki, Tachikawa (JP); Moungi G. Bawendi, Cambridge, MA (US); Vladimir Bulovic, Lexington, MA (US); Jennifer Scherer, Cambridge, MA (US)

(72) Inventors: Geoffrey J. S. Supran, Cambridge, MA (US); Katherine W. Song, Cambridge, MA (US); Gyuweon Hwang, Cambridge, MA (US); Raoul Emile Correa, West Hartford, CT (US); Yasuhiro Shirasaki, Tachikawa (JP); Moungi G. Bawendi, Cambridge, MA (US); Vladimir Bulovic, Lexington, MA (US); Jennifer Scherer, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/101,867

(22) Filed: Dec. 10, 2013

(65) Prior Publication Data

US 2014/0158977 A1 Jun. 12, 2014

Related U.S. Application Data

(60) Provisional application No. 61/735,344, filed on Dec. 10, 2012.

(51) Int. Cl.
*H01L 29/06* (2006.01)
*H01L 31/00* (2006.01)
(Continued)

(52) U.S. Cl.
CPC ........... *H01L 33/28* (2013.01); *H01L 51/502* (2013.01); *H01L 21/02601* (2013.01); (Continued)

(58) Field of Classification Search
CPC ........... H01L 31/035218; H01L 31/055; H01L 21/02601; H01L 51/426
See application file for complete search history.

(56) References Cited

U.S. PATENT DOCUMENTS 7,358,101 B2 * 4/2008 Yang et al. .................... 438/21
8,884,511 B2 * 11/2014 Gibson et al. ................ 313/503
(Continued)

OTHER PUBLICATIONS

PCT/US2013/074087 Notification Concerning Transmittal of International Preliminary Report for Patentability (PCT/IB/326) dated Jun. 25, 2015.

(Continued)

*Primary Examiner* — Zandra Smith
*Assistant Examiner* — John M Parker
(74) *Attorney, Agent, or Firm* — Steptoe & Johnson LLP

(57) ABSTRACT

A near-infrared light emitting device can include semiconductor nanocrystals that emit at wavelengths beyond 1 μm. The semiconductor nanocrystals can include a core and an overcoating on a surface of the core.

11 Claims, 15 Drawing Sheets d 5
4
3
2
1

(51) Int. Cl.

| | |
|---|---|
| ***H01L 33/28*** | (2010.01) |
| *H01L 51/42* | (2006.01) |
| *H01L 31/055* | (2014.01) |
| *H01L 21/02* | (2006.01) |
| *H01L 31/0352* | (2006.01) |
| *H01L 51/50* | (2006.01) |

(52) U.S. Cl.
CPC .... *H01L 31/035218* (2013.01); *H01L 31/055* (2013.01); *H01L 51/426* (2013.01); *H01L 51/5008* (2013.01)

(56) References Cited

U.S. PATENT DOCUMENTS

| | | | | |
|---|---|---|---|---|
| 2005/0129947 | A1 | 6/2005 | Peng | |
| 2005/0236556 | A1* | 10/2005 | Sargent et al. | 250/214.1 |
| 2007/0045777 | A1 | 3/2007 | Gillies | |
| 2007/0103068 | A1 | 5/2007 | Bawendi | |
| 2008/0074050 | A1 | 3/2008 | Chen | |
| 2009/0078928 | A1 | 3/2009 | Koshida | |
| 2009/0278141 | A1 | 11/2009 | Coe-Sullivan | |
| 2010/0109521 | A1* | 5/2010 | Yang | C09K 11/02 313/509 |
| 2011/0080090 | A1 | 4/2011 | Wood | |
| 2012/0241723 | A1 | 9/2012 | Klem | |

OTHER PUBLICATIONS

PCT/US2013/074087 Notification of Transmittal of the International Search Report and the Written Opinion of the International Searching Authority, or the Declaration dated May 8, 2014.

* cited by examiner

NEAR-INFRARED LIGHT EMITTING DEVICE USING SEMICONDUCTOR NANOCRYSTALS

PRIORITY CLAIM

This application claims priority to U.S. Provisional Application Ser. No. 61/735,344, filed Dec. 10, 2012, the contents of which are incorporated herein by reference in its entirety.

STATEMENT REGARDING FEDERALLY SPONSORED RESEARCH OR DEVELOPMENT

This invention was made with government support under Contract No. W911NF-07-D-0004 awarded by the Army Research Office and under Grant No. DE-SC0001088 awarded by the Department of Energy. The government has certain rights in the invention.

FIELD OF THE INVENTION

This invention relates to light emitting devices using semiconductor nanocrystals.

BACKGROUND

Light-emitting devices can be used, for example, in displays (e.g., flat-panel displays), screens (e.g., computer screens), and other items that require illumination. The materials used for the devices can have an energy gap corresponding to near-infrared, visible, or near-ultraviolet light. But the performance of near-infrared light-emitting devices has historically been low compared with visible-emitting devices.

SUMMARY

In general, a light emitting device can include semiconductor nanocrystals. The light emitting device can emit light in the near-infrared spectral region, for example, light having wavelengths between 1100 nm and 1400 nm. The light emitted from the device can be substantially free of light having wavelength of less than 1000 nm.

In one aspect, a near-infrared light emitting device can include a first electrode, a second electrode, a plurality of semiconductor nanocrystals disposed between the first electrode and the second electrode, wherein the plurality of semiconductor nanocrystals emit at wavelengths beyond 1 μm.

In another aspect, a method for preparing a near-infrared light emitting device can include depositing a first electrode, depositing a second electrode, and depositing a plurality of semiconductor nanocrystals between the first electrode and the second electrode, wherein the plurality of semiconductor nanocrystals emit at wavelengths beyond 1 μm. In certain embodiments, the near-infrared light emitting device can include a plurality of semiconductor nanocrystals that emit between 1100 nm and 1400 nm. Each of the plurality of semiconductor nanocrystals can include a core including a semiconductor material. In certain embodiments, the core can include an overcoating on a surface of the core, the overcoating including a semiconductor material having a composition different from the composition of the core. In certain embodiments, the core can include PbS, PbSe, or PbTe, or a mixture thereof. In certain embodiments, the overcoating can include CdS, CdSe, CdTe, ZnS, ZnSe, or ZnTe, or a mixture thereof. In certain embodiments, the plurality of semiconductor nanocrystals that includes an overcoating can reduce quenching from a metal oxide in an adjacent layer of the plurality of semiconductor nanocrystals. In certain embodiments, the core can be PbS and the overcoating can include CdS. In certain embodiments, the semiconductor nanocrystals can be overcoated by cation exchange.

In certain embodiments, the device can include an electron-transport layer. In certain embodiments, the device can include a hole-transport layer. In certain embodiments, the device can include an adjacent layer of the plurality of semiconductor nanocrystals which can include a metal oxide. In certain embodiments, the device can have a peak external quantum efficiency of at least 2% or at least 4%. In certain embodiments, the device can have an average peak power conversion efficiency of at least 1% or at least 2%.

Other aspects, embodiments, and features will be apparent from the following description, the drawings, and the claims.

DETAILED DESCRIPTION

Figures 1A, 1B, 1C:
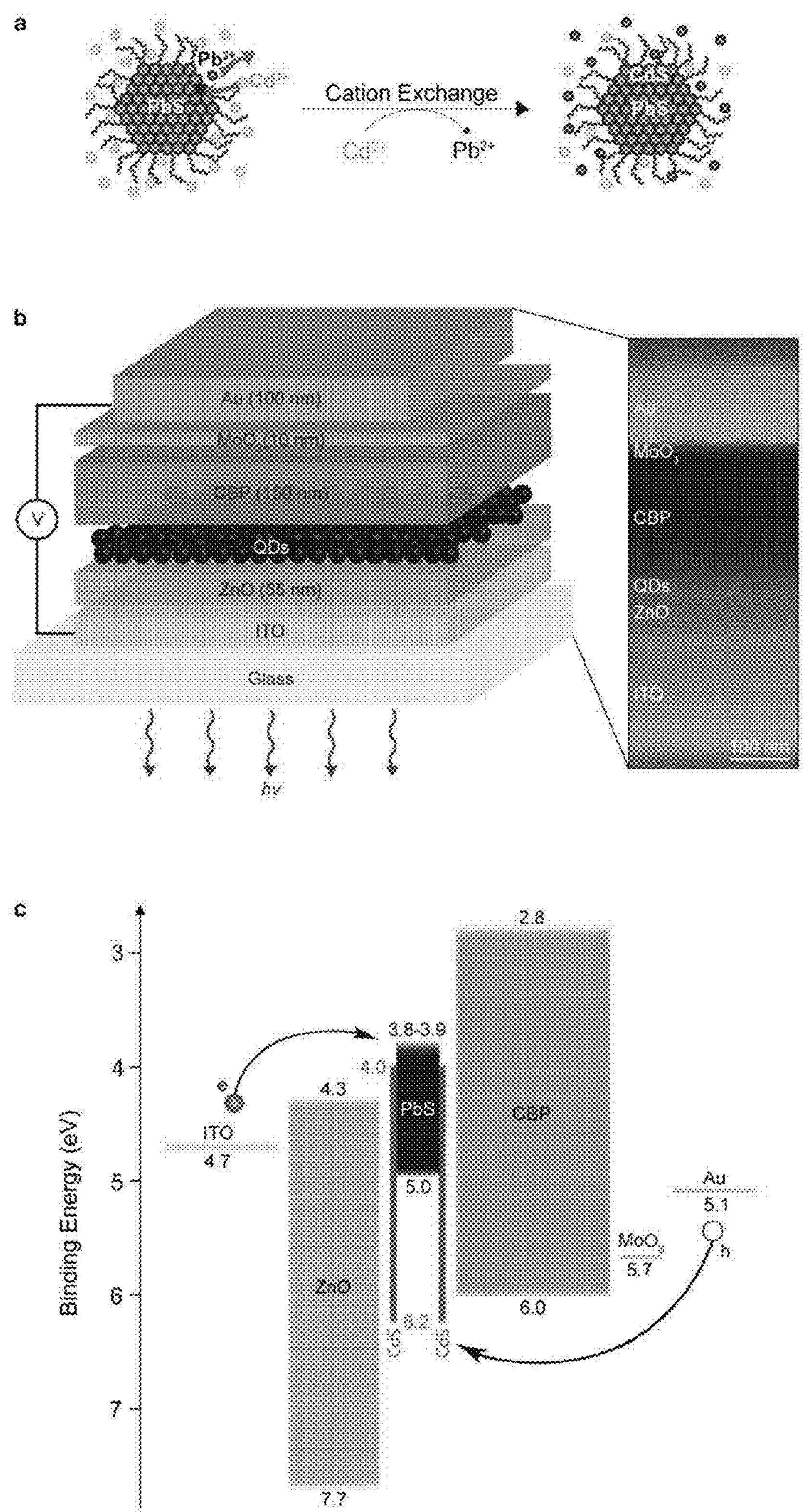
FIG. 1*a*-FIG. 1*c* show semiconductor nanocrystal (NC), or quantum dot (QD), synthesis and one example of NC-LED design.

Near-infrared light sources integrated at room temperature with any planar surface can be realized by harnessing the broad spectral tunability, high brightness and solution-processability of colloidal semiconductor nanocrystals (NCs). Yet the performance of near-infrared semiconductor nanocrystal light-emitting devices (NC-LEDs) has historically been low compared with visible-emitting devices. PbS—CdS core-shell NCs can enhance the peak external quantum efficiency (EQE), compared with that PbS core-only control devices, by 50- to 100-fold, up to 4.3±0.3%. 'Turn-on' voltages can be lowered by 0.6±0.2V and per-amp radiant intensities can be increased by up to 150 times. Peak EQEs and power conversion efficiencies can be more than double those of previous NC-LEDs emitting at wavelengths beyond 1 μm, and are comparable with those of commercial near-infrared LEDs. One origin of the performance enhancement is passivation of PbS cores by CdS shells against in situ photoluminescence quenching, suggesting that core-shell NCs may become a mainstay of high-efficiency near-infrared NC-LEDs.

The nanocrystal, or the semiconductor nanocrystal, can be a member of a population of nanocrystals having a narrow size distribution. The nanocrystal can be a sphere, rod, disk, or other shape. The nanocrystal can include a first semiconductor material, a ceramic material, a magnetic material, or a metallic material, for example, gold, iron oxide, titanium dioxide, cerium oxide or other metal chalcogenide or pnictide. The nanocrystal can include a first semiconductor material having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. The first semiconductor material can include a Group II-VI compound, a Group II-V compound, a Group III-VI compound, a Group III-V compound, a Group IV-VI compound, a Group I-III-VI compound, a Group II-IV-VI compound, a Group II-IV-V compound, or mixtures thereof. For example, the first semiconductor material can include ZnO, ZnS, ZnSe, ZnTe, CdO, CdS, CdSe, CdTe, MgO, MgS, MgSe, MgTe, HgO, HgS, HgSe, HgTe, AN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

In some embodiments, the nanocrystal includes a first semiconductor material including a Group I-III-VI compound. For example, the first semiconductor material can include for example, a copper indium diselenide such as a doped copper indium diselenide or other copper indium diselenide, or alloyed copper indium diselenide, such as, for example, copper indium zinc diselenide, or copper indium gallium diselenide. The first semiconductor material can include a copper indium disulfide such as a doped copper indium disulfide or other copper indium disulfide, or alloyed copper indium disulfide. Other elements alloyed with copper indium diselenide and/or copper indium disulfide can include sulfur, aluminum, or silver; for example, $CuInS_2$, $CuIn(S,Se)_2$, $Cu(IN,Al)Se_2$, $Cu(IN,Ag)Se_2$, or others.

The nanocrystal can include a second semiconductor material. The second semiconductor material can include a composition different from the composition of the first semiconductor material. The first and second semiconductor materials can be selected to provide a desired band structure, such as a type I or a type II heterostructure. The second semiconductor material can be adjacent to the first semiconductor material, such that a junction is formed. The junction can be abrupt or graded. In a graded junction, the first material blends with the second material in the junction, providing a graded change in material. In contrast, in an abrupt junction there is little or substantially no blending of the materials.

The second semiconductor material of the nanocrystal can include a Group II-VI compound, a Group II-V compound, a Group III-VI compound, a Group III-V compound, a Group IV-VI compound, a Group compound, a Group II-IV-VI compound, a Group II-IV-V compound, or mixtures thereof. For example, the second semiconductor material can include ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals.

An alloy can have the formula $M^1{}_iM^2{}_jM^3{}_kE^1{}_xE^2{}_yE^3{}_z$. $M^1$, $M^2$ and $M^3$ can each independently be a group I, group II, group III, or group IV element. $E^1$, $E^2$ and $E^3$ each independently can be a group IV, group V, or group VI element. For example, $M^1$, $M^2$ and $M^3$ can each independently be magnesium, zinc, copper, cadmium, mercury, aluminum, gallium, indium, thallium, silicon, germanium, tin, or lead; and $E^1$, $E^2$ and $E^3$ each independently can be silicon, germanium, tin, lead, nitrogen, phosphorus, arsenic, antimony, oxygen, sulfur, selenium, or tellurium.

The values of i, j, k, x, y, and z are positive or zero. In some instances, the value of i, j, k, x, y, or z can be an integer. For example, an alloy can have the formula $M^1E^1{}_xE^2{}_y$. In this formula, the value of i is 1 and the values of j and k are zero (alternatively, $M^1$, $M^2$ and $M^3$ are identical), and the value of z is zero (alternatively, $E^2$ and $E^3$ are identical). The sum of i, j and k can be an integer, and the sum of x, y and z can be an integer. For example, if the sum of x and y is 1, the preceding formula can be expressed as $M^1E^1{}_xE^2{}_{1-x}$. In another example, an alloy can have the formula $M^1{}_iM^2{}_{1-i}E^1$. An alloy can have the formula $M^1{}_iM^2{}_jM^3{}_kE^1{}_x$ or $M^1{}_iM^2{}_jM^3{}_kE^1{}_xE^2{}_y$.

A nanocrystal having a central region and a distal region (or regions) can be described by a radius ratio. The radius ratio can be defined as the ratio of the radius of the distal region to the radius of the central region. The central region can have a radius in the range of 1 nm to 7 nm (such as between 1.5 nm and 5 nm), and the distal regions can have a radius in the range of 1 nm to 10 nm (such as between 1.5 nm and 5 nm). Accordingly, a barbell-shaped nanocrystal can have a radius ratio in the range of 0.1 to 10 (such as between 0.3 and 3.5). In some embodiments the radius ratio can be about 1. In other embodiments it can be substantially different from 1, such as, for example, between 0.1 and 0.95 or between 1.05 and 10.

The junction between two semiconductor materials can have different configurations depending on the shape of the nanocrystal. For example, a spherical nanocrystal can have a spherical core of a first semiconductor material coated with a shell of a second semiconductor material. A rod shaped nanocrystal can have a rod of a first semiconductor material and a second semiconductor material. The second semiconductor material can coat the length and ends of the rods substantially evenly. Alternatively, the length and ends of the rod can be coated to different degrees. In particular, the ends of the rod can coated to a greater degree than the length of the rod. The ends of the rod each can be coated by an approximately spherical region of a second semiconductor material. In this case, the nanocrystal can have a barbell shape.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region.

The population of nanocrystals can have a narrow size distribution. The population can be monodisperse and can exhibit less than a 15% rms deviation in size of the nanocrystals, preferably less than 10%, more preferably less than 5%. Spectral emissions in a narrow range of between 10 and 150 nm full width at half max (FWHM) can be observed (in other words, FWHM of less than 0.05 eV, or of less than 0.03 eV). Semiconductor nanocrystals can have emission quantum efficiencies of greater than 2%, 5%, 10%, 20%, 40%, 60%, 70%, or 80%.

The method of manufacturing a nanocrystal can be a colloidal growth process and can produce a monodisperse particle population. Colloidal growth occurs by rapidly injecting an M donor(s) and an E donor(s) into a hot coordinating agent. In another variation, the M donor or M donors are dissolved in a hot coordinating agent, and an E donor or E donors are rapidly injected. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. Preparation and manipulation of nanocrystals are described, for example, in U.S. Pat. No. 6,322,901, which is incorporated by reference in its entirety.

The nanocrystal is a member of a population of nanocrystals. As a result of the discrete nucleation and controlled growth, the population of nanocrystals obtained can have a narrow, monodisperse distribution of sizes. The process of controlled growth and annealing of the nanocrystals in the coordinating agent that follows nucleation can also result in uniform surface derivatization and regular core structures. As the size distribution sharpens, the temperature can be raised to maintain steady growth. By adding more M donor or E donor, the growth period can be shortened.

The M donor(s) can be an inorganic compound, an organometallic compound (e.g., an alkyl metal compound such as triethyl gallium or trimethyl indium), or elemental metal. The inorganic compound can be a salt (e.g., a carboxylate salt, an acetylacetonate salt, a metal halide, a metal oxide, a metal alkoxide, and the like). The salt can be combined with a coordinating agent, such as an amine. See, for example, U.S. Pat. No. 6,576,291, which is incorporated by reference in its entirety. M can be cadmium, zinc, copper, magnesium, mercury, aluminum, gallium, indium or thallium. The E donor(s) can be a compound capable of reacting with the M donor to form a material with the general formula $M^1_iM^2_jM^3_kE^1_xE^2_yE^3_z$. Typically, the E donor is a chalcogenide donor or a pnictide donor, such as a phosphine chalcogenide, a bis(silyl) chalcogenide, dioxygen, an ammonium salt, or a tris(silyl) pnictide. Suitable E donors include dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), bis (trimethylsilyl)sulfide ($(TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris(trimethylsilyl) antimonide ($(TMS)_3Sb$). In certain embodiments, the M donor and the E donor can be moieties within the same molecule.

A coordinating agent can help control the growth of the nanocrystal. The coordinating agent is a compound having a donor lone pair that, for example, has a lone electron pair available to coordinate to a surface of the growing nanocrystal. The coordinating agent can be a solvent. Solvent coordination can stabilize the growing nanocrystal. Typical coordinating agents include alkyl phosphines, alkyl phosphine oxides, alkyl phosphonic acids, or alkyl phosphinic acids, however, other coordinating agents, such as pyridines, furans, and amines may also be suitable for the nanocrystal production. Examples of suitable coordinating agents include pyridine, tri-n-octyl phosphine (TOP) and tri-n-octyl phosphine oxide (TOPO). Technical grade TOPO can be used.

Nanocrystal shape can be determined by synthesis conditions, notably by the coordinating solvent(s) present during nanocrystal synthesis. The nanocrystal can be a sphere, rod, disk, or other shape. See, e.g., U.S. Pat. Nos. 6,225,198; 6,306,736; and 6,855,202, each of which is incorporated by reference in its entirety. Nanocrystal shape can be further controlled by the conditions under which a second semiconductor material is added to the nanocrystal.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average size, a population having a desired average nanocrystal size can be obtained.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean size, preferably 10% rms deviation or less, and more preferably 5% rms deviation or less.

A cap including a second semiconductor material can be added to the nanocrystal. A capping process is described, for example, in U.S. Pat. No. 6,322,901, which is incorporated by reference in its entirety. By adjusting the temperature of the reaction mixture during capping and monitoring the absorption spectrum of the core, capped materials having high emission quantum efficiencies and narrow size distributions can be obtained. The shape of the cap can depend on the shape of the initial nanocrystal and the capping conditions used. For example, a cap grown on an approximately spherical nanocrystal can also be approximately spherical. In this case, the cap can substantially coat the spherical nanocrystal. If the initial nanocrystal is rod-shaped, the cap can be grown primarily on the ends of the rod and very little of the second semiconductor material added along the axis of the rod. A rod-shaped nanocrystal can be capped with a rod-shaped cap, or with an approximately spherical cap. Capping conditions, such as solvent composition and temperature, can determine the shape of the cap. For example, when caps are added under conditions that favor rod-shaped growth, rod-shaped caps can be formed; in contrast, approximately spherical caps are formed when the capping conditions favor approximately spherical growth.

It can be advantageous to purify nanocrystals before a second material is added to the nanocrystal. As discussed above, the nanocrystals can be purified by size-selective precipitation. After purification the nanocrystals can be treated with an etching agent. The etching agent can reduce the number of defect sites on the nanocrystals. Defect sites can act as undesired nucleation sites during addition of a second material. In making barbell-shaped nanocrystals, nucleation is desired at the ends of rods, but defect sites can cause nucleation along the length of a rod. Because the etching agent reduces the number of defect sites, the resulting barbells will have fewer warts along the length of the rods than barbells prepared without a prior etching treatment. The etching agent can be an amine, such as a primary amine, e.g., octylamine. An etching agent can be included during addition of a second semiconductor material to a nanocrystal.

Two-pot synthesis of nanocrystals can improve (compared to one-pot synthesis) the quality of the heterojunction by minimizing contamination of the one material with the other material. Adding the nanocrystals at temperatures normally used for core growth (rather than nucleation) can reduce overcoating of a rod (e.g., along the length of the rod) by the second semiconductor material.

The outer surface of the nanocrystal can include a layer of compounds derived from the coordinating agent used during the growth process. The surface can be modified by repeated exposure to an excess of a competing coordinating group to form an overlayer. For example, a dispersion of the nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Electrically-driven and wavelength-selectable near-infrared (NIR) and shortwave infrared (SWIR) light sources that can be deposited on any substrate and at lower cost than existing (usually epitaxially grown) IR-emitters have the potential to enhance existing technologies and to trigger the development of new ones. See, for example, Shirasaki, Y. et al., *Nature Photonics* 7, 13-23 (2013), which is incorporated by reference in its entirety. Beneficiaries can include optical telecommunications and computing; bio-medical imaging; on-chip bio(sensing) and spectroscopy; and night-time surveillance and other security applications. See, for example, Klem, E. J. D. et al., *Applied Physics Letters* 87, 053101 (2005); Sargent, E. H., *Advanced Materials* 17, 515-522 (2005); Lim, Y. T. et al., *Molecular Imaging* 2, 50-64 (2003); Kim, S. et al., *Nature Biotechnology* 22, 93-7 (2004); Medintz, I. L. et al., *Nature Materials* 4, 435-46 (2005); Frasco, M. F. et al., *Sensors* 9, 7266-86 (2009), each of which is incorporated by reference in its entirety. Among the candidate large-area planar light-emitting technologies, colloidal semiconductor nanocrystal light-emitting devices (NC-LEDs) and organic LEDs (OLEDs) stand out, as they enable room-temperature processing and non-epitaxial deposition. Between them, NC-LEDs should perform better at wavelengths beyond $\lambda$=1 μm because in this spectral range the luminescent organic dyes used in OLEDs exhibit lower photoluminescence quantum-yields ($\eta_{PL}$<5%) than the colloidal NCs used in NC-LEDs. See, for example, Qian, G. et al., *Advanced Materials* 21, 111-116 (2009), which is incorporated by reference in its entirety. The photoluminescence (PL) emission wavelength of NCs can be precisely tuned through quantum-confinement effects, with high $\eta_{PL}$ maintained throughout the visible and NIR ($\eta_{PL}$>95% and $\eta_{PL}$>50%, respectively, in solution). See, for example, Chen, O. et al., *Nature Materials* 12, 1-7 (2013), which is incorporated by reference in its entirety. Furthermore, solution processability of NCs enables their epitaxy-free integration with Si-electronics. See, for example, Cho, K.-S. et al., *Nature Photonics* 3, 341-345 (2009), which is incorporated by reference in its entirety. NIR NC-LEDs can have peak external quantum efficiencies (EQEs) of 8.6% at $\lambda$<1 μm and 2% at $\lambda$>1 μm, compared with 6.3% and <0.3% for OLEDs, respectively. See, for example, Sun, L. et al., *Nature Nanotechnology* 7, 369-373 (2012); Cheng, K.-Y. et al., *Nano Letters* 11, 1952-6 (2011); Borek, C. et al., *Angewandte Chemie* 46, 1109-12 (2007), each of which is incorporated by reference in its entirety.

The performance of $\lambda$>1 μm NIR NC-LEDs can be raised by adopting strategies used in visible-emitting NC-LEDs, which can have EQEs of up to 18% in the red. See, for example, Mashford, B. S. et al., *Nature Photonics* 7, 407-412 (2013), which is incorporated by reference in its entirety. One notable difference to date is that while visible-emitting NC-LEDs have employed core-shell NCs (NC cores overcoated by a wider band-gap inorganic shell) almost since their inception, NIR NC-LEDs have, with one exception, been based solely on core-only NCs. See, for example, Schlamp, M. C. et al., *Journal of Applied Physics* 82, 5837 (1997); Pal, B. N. et al., *Nano Letters* 12, 331-6 (2012); Tessler, N. et al., *Science* 295, 1506-8 (2002); Solomeshch, O. et al., *Journal of Applied Physics* 98, 074310 (2005), each of which is incorporated by reference in its entirety. The use of NIR NCs without shells can compromise their intrinsic $\eta_{PL}$, increase their susceptibility to extrinsic PL quenching processes, and reduce their photostability. See, for example, Pietryga, J. M. et al., *J. Am. Chem. Soc.* 130, 4879-85 (2008), which is incorporated by reference in its entirety. Secondly, the use of 'type-IV' (organic-NC-inorganic hybrid) NC-LED architectures (as defined in Shirasaki et al.), which have shown the highest EQEs, has heretofore been restricted almost exclusively to visible-emitting devices. See, for example, Shirasaki, Y. et al., *Nature Photonics* 7, 13-23 (2013), which is incorporated by reference in its entirety. A NIR 'type-IV' NC-LED can be prepared and the use of core-shell PbS—CdS NCs can result in an enhancement of peak EQEs of one to two orders of magnitude over PbS core-only controls. This is shown to be a consequence of increased in situ NC $\eta_{PL}$ accrued by virtue of the passivating CdS shell. The peak EQEs and power conversion efficiencies obtained can surpass those of any previously reported λ>1 μm NIR NC-LED.

The roles of the NC core-shell structure and of the NC-LED 'type-IV' architecture can be inextricably linked. While the former largely explains the enhancement in EQEs observed, the latter can be central to their high absolute magnitudes. The 'type-IV' design is conducive to efficient carrier recombination because it allows the processes of charge-transport and light-emission to be decoupled. The only two previously reported NIR NC-LEDs not possessing a 'type-I' structure (a more rudimentary architecture in which NCs play dual roles of CTL and emission centre) have also been the highest performing. See, for example, Sun, L. et al., *Nature Nanotechnology* 7, 369-373 (2012); Cheng, K.-Y., *Nano Letters* 11, 1952-6 (2011), each of which is incorporated by reference in its entirety. Together, cation-exchanged core-shell NCs and a 'type-IV' device architecture can offer a new paradigm for the design of high-efficiency NIR NC-LEDs.

The efficiency of NIR NC-LEDs can be enhanced by up to 100 times by replacing NIR core-only NCs with core-shell NCs, as a result of a corresponding increase in in situ NC $\eta_{PL}$. As the demand for high brightness—and therefore high current density—NC-LEDs continues to necessitate the use of metal oxide charge-transport materials (that commonly quench NC PL), the use of core-shell NCs can serve as a general strategy by which to maximise the performance of future NIR NC-LEDs. See, for example, Wood, V. et al., *ACS Nano* 3, 3581-6 (2009), which is incorporated by reference in its entirety.

EXAMPLE

NC and Zinc Precursor Synthesis

Core-only PbS NCs were synthesized using a large-scale method and core-shell PbS—CdS NCs were synthesized by cation-exchange. See, for example, Hines, M. A. et al., *Advanced Materials* 15, 1844-1849 (2003); Kovalenko, M. V. et al., *Journal of the American Chemical Society* 134, 2457-60 (2012), each of which is incorporated by reference in its entirety. NC shell thicknesses were deduced from elemental analysis of drop-cast films on glass substrates by wavelength dispersive spectroscopy.

PbS: A lead precursor is prepared by heating 30 mmol of lead acetate trihydrate (Sigma Aldrich), 125 mL of octadecene (Sigma Aldrich) and 175 mL of oleic acid (TCI) in a round-bottomed flask for 12 hours under vacuum at 100° C. A sulphur precursor is prepared by adding 15 mmol hexamethyldisilithiane (Fluka) to 150 mL of octadecene. The lead precursor is placed under nitrogen and heated to 150° C. before injection of the sulphur precursor. After cooling to room temperature, this solution is transferred into a nitrogen-filled glove box without air exposure. The synthesized PbS NCs are purified by adding methanol and 1-butanol until the solution is turbid, followed by centrifugation to precipitate the NCs. The supernatant is discarded and the NCs are re-dissolved in hexane.

PbS—CdS: PbS—CdS core-shell NCs are prepared by cation-exchange. To control shell thickness, exchange is performed at 80 to 100° C. for between 5 min and 2 hours under nitrogen using an excess of cadmium oleate.

Core-only (control) oleic-acid-capped PbS NCs are synthesized first. The NCs are then subjected to a partial $Pb^{2+}$-to-$Cd^{2+}$ cation-exchange reaction (FIG. 1*a*), whereby the addition of a large excess of cadmium oleate yields core-shell PbS—CdS NCs, also capped with oleic acid. Growing wide band-gap shells like CdS on PbS cores by cation-exchange likely circumvents mismatch of crystal structures encountered in traditional shell growth techniques.

The core-only PbS NCs have a mean diameter of 4.0 nm, deduced by transmission electron miscroscopy (TEM) and from the spectral position of the 1S excitonic absorption peak. This corresponds to a peak PL wavelength of λ=1315 nm in solution. By cation-exchange two types of thin-shelled PbS—CdS NCs can be synthesized and one type of thicker-shelled PbS—CdS NCs. The thin-shelled NCs have core diameters of 3.6 nm and shell thicknesses equivalent to 0.2 nm (assuming uniform shell coverage), but are distinguished by their synthesis injection temperatures of 80° C. (PbS—CdS (0.2 nm, Sample A)) and 100° C. (PbS—CdS (0.2 nm, Sample B)), respectively. The thicker-shelled PbS—CdS NCs have a core diameter of 2.6 nm and a shell thickness equivalent to 0.7 nm (PbS—CdS (0.7 nm)) (again assuming uniform shell coverage). These dimensions were determined by wavelength dispersive spectroscopy.

Zinc acetate dihydrate solution preparation: The ZnO precursor can be prepared, dissolving zinc acetate dihydrate ($Zn(CH_3COO)_2.2H_2O$, Aldrich, 99.999%, 12.56 g) and ethanolamine ($NH_2CH_2CH_2OH$, Aldrich, >99.5%, 3.2 mL) in anhydrous 2-methoxyethanol ($CH_3OCH_2CH_2OH$, Aldrich, 99.8%, 76.8 mL) under agitation in an ultrasonic bath for 4 hours. The solution was stored in a nitrogen-filled glovebox. See, for example, Znaidi, L., *Materials Science and Engineering: B* 174, 18-30 (2010), which is incorporated by reference in its entirety.

Optical Measurements

NIR EL and PL spectra, transient PL data and $\eta_{PL}$ from the integrating sphere are collected in air, before which active sample areas are hermetically encapsulated by a glass coverslip in a nitrogen-filled glovebox using a solvent-free self-curing two-part epoxy (Torr Seal) rated to $10^{-9}$ Torr.

NIR EL and steady-state PL data are collected through a μ=850 nm long-pass filter with a Princeton Instruments Spectra Pro 300i spectrometer coupled to a liquid nitrogen-cooled Princeton Instruments OMA V InGaAs CCD array detector. The excitation source for steady-state NIR PL is a λ=655 nm diode laser (Thorlabs), which ensures that in the relative $\eta_{PL}$ measurement only the NCs, and not ZnO or CBP, are significantly excited. The fixed geometry of the setup maximises the comparability of relative PL intensities. A fiber-coupled Ocean Optics SD2000 spectrometer is used to monitor for visible EL.

Transient PL data is measured by exciting glass/ZnO/NC samples at λ=633 nm and collecting resulting PL using superconducting nanowire single photon detectors, as previously reported. See, for example, Correa, R. E. et al., *Nano Letters* 12, 2953-8 (2012), which is incorporated by reference in its entirety.

For both steady-state and transient measurements of relative in situ NC $\eta_{PL}$, care was taken to record data in a low excitation-intensity regime (0.5 mW $cm^{-2}$ for the steady-state experiments) where PL intensity was not decaying with time (due to irreversible photobleaching), and at many sample locations to confirm homogeneity. To extract relative $\eta_{PL}$, steady-state PL spectra were scaled to account for the spectral responsivity of the InGaAs CCD and for differences in relative absorbance between NC samples.

Absolute $\eta_{PL}$ measurements are performed using an integrating sphere and calibrated reference detectors as described previously. See, for example, Geyer, S. M. et al., *ACS Nano* 5, 5566-71 (2011), which is incorporated by reference in its entirety.

NIR EL photographs are taken with a Xenics Xeva-2,5-320 HgCdTe short-wave infrared camera.

Light emitting device and sample fabrication

Using these NCs, NC-LEDs can be fabricated comprising a zinc oxide (ZnO) sol-gel-derived, solution-processed electron-transport layer (ETL) and an organic small molecule hole-transport layer (HTL) of 4,4-bis(carbazole-9-yl)biphenyl (CBP), sandwiching a film of NCs in an inverted 'type-IV' device architecture. Thin films of indium tin oxide (ITO), gold (Au) and molybdenum oxide ($MoO_3$) serve as cathode, anode and hole-injection layers, respectively. See, for example, Wang, Z. B. et al., *Journal of Applied Physics* 108, 024510 (2010); Wang, Z. B. et al., *Nature Photonics* 5, 753-757 (2011), each of which is incorporated by reference in its entirety. A schematic diagram of the NC-LED and a scanning electron microscope (SEM) image of its cross-section are shown in FIG. 1*b*. Its corresponding energy band-diagram is depicted in FIG. 1*c*. $MoO_3$ can play a vital role of mediating efficient hole-injection from the Au anode into the deep highest occupied molecular orbital (HOMO) of CBP.

Figure 1D:
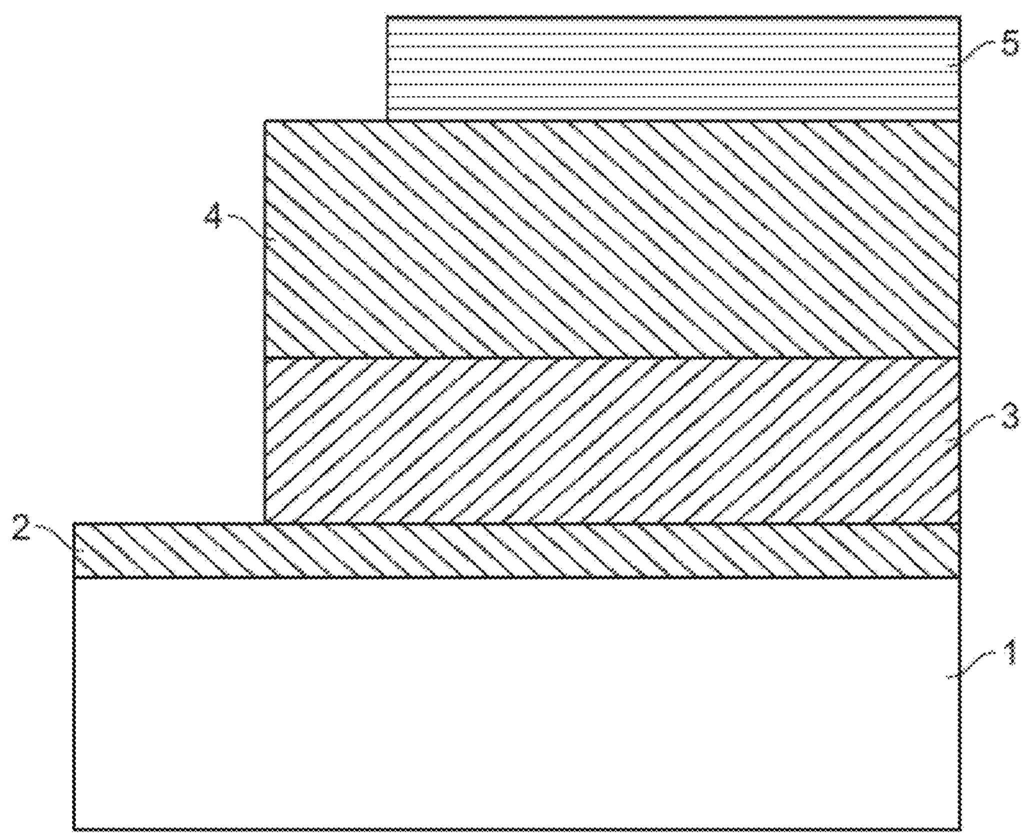
FIG. 1*d* is a schematic drawing depicting a light-emitting device.

FIG. 1*a*-1*c* shows an example of NC synthesis and NC-LED design. A light emitting device can have a structure such as shown in FIG. 1*d*, in which a first electrode 2, a first layer 3 in contact with the electrode 2, a second layer 4 in contact with the layer 3, and a second electrode 5 in contact with the second layer 4. First layer 3 and second layer 4 can each be an insulating dielectric. One of the electrodes of the structure is in contact with a substrate 1. Each electrode can contact a power supply to provide a voltage across the structure. Electroluminescence can be produced by the emissive layer of the heterostructure when a voltage of proper polarity is applied across the heterostructure. A separate emissive layer (not shown in FIG. 1*d*) can be included in the device, for example between first layer 3 and second layer 4. The separate emissive layer can include a wide band gap material.

FIG. 1*a* shows a schematic illustration of the cation-exchange reaction used to convert core-only PbS NCs into core-shell PbS—CdS NCs. FIG. 1*b* shows device architecture (left) and cross-sectional SEM image (right) of the 'type-IV' NC-LED based on these NCs. FIG. 1*c* shows the NC-LED's flat-band energy level diagram. Band energies are in eV (referenced to the vacuum level) and are taken from literature. See, for example, Helander, M. G. et al., *Science* (New York, N.Y.) 332, 944-7 (2011); Sun, Y. et al., *Advanced Materials* 23, 1679-83 (2011); Lee, H. et al., *Advanced Functional Materials* 19, 2735-2742 (2009); Jasieniak, J. et al., *ACS Nano* 5, 5888-902 (2011); Greiner, M. T. et al., *Nature Materials* 11, 76-82 (2012); Park, Y. et al., *Applied Physics Letters* 68, 2699 (1996); Kinder, E. et al., *Journal of the American Chemical Society* 133, 20488-99 (2011), each of which is incorporated by reference in its entirety. Based on the model in Jasieniak et al., the electron affinity of PbS is tuned from approximately 3.8 eV to 3.9 eV by the reduction in core size (from 4.0 nm to 3.6 nm) accompanying cation-exchange.

Prior to device fabrication, the NCs undergo three rounds of precipitation and centrifugation with methanol and 1-butanol and are then re-dissolved in chloroform at 40 mg $mL^{-1}$ and filtered (0.45 μm PTFE). Devices are fabricated on glass substrates that are pre-patterned with a 150 nm thick film of indium-tin-oxide (ITO) (obtained from Thin Film Devices) and cleaned with solvent and oxygen-plasma. First, a zinc acetate dihydrate solution is spin-cast onto the ITO at 2000 rpm for 30 s in a nitrogen-filled glovebox. The xerogel is then sintered on a hot-plate at 300° C. for 5 min in the 10-20% relative humidity environment of a glove-bag continuously flushed with dry air. This process results in the crystallisation of 55±1 nm (by optical ellipsometry (Gaertner Scientific)) thick ZnO films and mitigates the sensitivity of ZnO to variations in atmospheric conditions. NC films are then deposited by spin-coating ~40 μL of ~5 mg $mL^{-1}$ PbS (or PbS—CdS) NCs in chloroform at 1500 rpm for 60 s; film thicknesses of 8±1 nm are obtained, as determined by thickness-concentration calibration curves measured by profilometer (Tencor P-16). This level of accuracy is necessary to allow the effect of shell thickness to be studied independently from the effects of NC film thickness. A 150 nm thick HTL of 4,4-bis(carbazole-9-yl)biphenyl (CBP) (purified before use via thermal gradient sublimation), a 10 nm thick hole-injection layer of molybdenum oxide ($MoO_3$) and a 100 nm thick Au anode (shadow masked) are then successively deposited via thermal evaporation at a rate of ~0.1 nm/s at a base pressure of $1\times10^{-6}$ Torr. Overlap of anode and cathode defines active area pixels of 1.21 $mm^2$. The glass/ZnO/NC/CBP and glass/ZnO/NC structures are fabricated by the same methods as the NC-LEDs.

NC Film Thickness Calibration Using Profilometer

In order to separate the effect of NC shell thickness from that of NC film thickness it is necessary to accurately control the latter. This is done by varying the concentration of the spin-cast NC chloroform solution. NC film thickness-concentration calibration curves are determined for each NC batch by spin-coating NC solutions of known concentrations onto ZnO (prepared identically to that in the NC-LEDs) and measuring their film thicknesses with a profilometer. To do this, an edge of each NC film is wiped-off with a chloroform-moistened polyurethane swab (VWR). Because this procedure does not detectably affect ZnO film thickness, the step-height measured by profilometer corresponds to NC film thickness. Roughly 15 line-scans per sample (5 line scans (μm separation) at 3 positions (mm separation)) yield the data plotted in FIG. 2. Orthogonal distance regressions, accounting for errors in both NC concentration and film thickness, are then used to calculate concentrations required for the 8±1 nm films used in all NC-LEDs.

Figure 3:
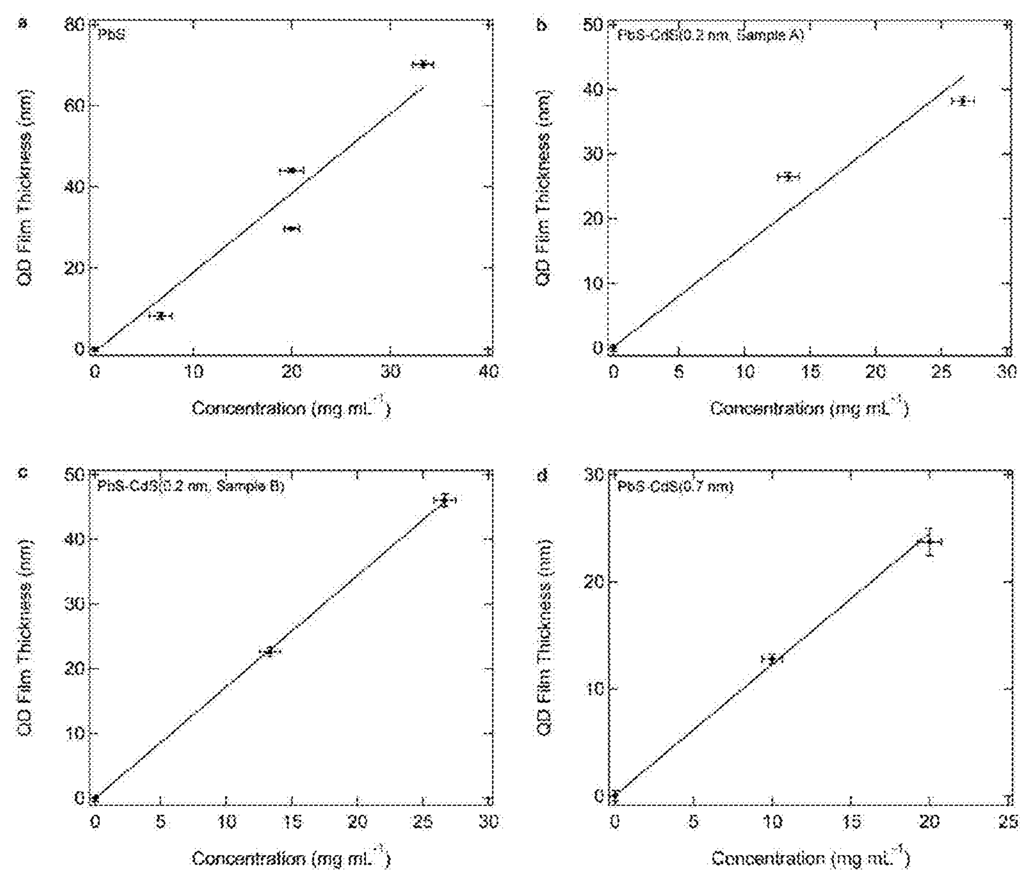
FIG. 3 shows NC film thickness-concentration calibration curves on zinc oxide.

FIG. 3 shows NC film thickness-concentration calibration curves on zinc oxide. In FIG. 3, black dots indicate average thicknesses (as measured by profilometer) of spin-cast films of NCs as a function of the NC solution's concentration in chloroform for: a, PbS; b, PbS—CdS (0.2 nm, Sample A); c, PbS—CdS (0.2 nm, Sample B); and d, PbS—CdS (0.7 nm) NCs. Horizontal error bars indicate uncertainties in concentrations and vertical error bars show standard deviations in measured thicknesses from multiple locations per sample. Solid lines are orthogonal distance regressions (Igor Pro 6.1, WaveMetrics, Inc.) from which concentrations used in NC-LED fabrication were determined.

Integrating Sphere Measurements of NC Photoluminescence Quantum-yields

Photoluminescence quantum-yields ($\eta_{PL}$) are measured and calculated as detailed in Geyer, except that here the wavelength dependence (weighted by the PL spectra of the drop-cast NC films) of the photodiode's responsivity was accounted for using an approach analogous to that for calculating EQE and radiance. See, for example, Geyer, S. M. et al., *ACS Nano* 5, 5566-71 (2011), which is incorporated by reference in its entirety. It was necessary to measure $\eta_{PL}$ for drop-cast (rather than spin-cast) films in order to detect sufficient signal. $\eta_{PL}$ is measured at four locations per sample, giving the means and standard deviations plotted in FIG. 4*a*.

Calculation and Error Estimate of EQE and Radiance

EQE is calculated as the ratio, per unit time, of the number of forward-emitted photons to the number of injected electrons, I(V)/|e|, where I(V) is the current passing through the NC-LED at an applied bias, V. This can be expressed as, $$EQE(V)[\%] = \frac{N_{phot}(V)|e|}{I(V)} \cdot g \cdot 100, \quad \text{(SI 1)}$$

where $N_{phot}$(V) is the number of forward-emitted photons actually collected by the photodiode, and the geometric factor, g, accounts for the solid angle of the EL profile (assumed to be Lambertian) subtended by the photodiode, $$\Omega = \pi / g : g = \frac{a^2 + L^2}{a^2}. \quad \text{(SI 2)}$$

Here a is the diameter of the active area of the photodiode and L is the distance between the emitting NC-LED pixel and this active area.

$N_{phot}$(V) can be calculated from the current output ('photocurrent', $I_{pc}^{meas}$) of the photodiode in response to detected EL at each applied bias, accounting for the wavelength dependence (weighted by the device's EL spectrum) of the photodiode's responsivity, R (λ).

To do this, first note that the area below a wavelength-resolved EL spectrum measured from a NC-LED, EL(λ), is proportional to the number of photons emitted per unit time. Then, multiplying this by the energy per photon hc/λ and by R(λ) [A $W^{-1}$], values obtained are proportional to measured photocurrent, $$I'_{pc}(\lambda) = EL(\lambda) \cdot \frac{hc}{\lambda} \cdot R(\lambda). \quad \text{(SI 3)}$$

Integrating between the wavelength limits of the EL spectrum ($\lambda_i$ and $\lambda_f$), a figure proportional to total measured photocurrent is then given by, $I_{pc}^{prop}(\lambda)=\int_{\lambda_i}^{\lambda_f} I_{pc}'(\lambda)d\lambda$(SI 4). Scaling EL(λ) to satisfy the requirement that $I_{pc}^{prop}(\lambda)$ equals $I_{pc}^{meas}$ yields a revised EL spectrum, EL(λ)', the area below which is now equal to the number of photons emitted per unit time.

$$EL(\lambda)' = EL(\lambda) \cdot \frac{I_{pc}^{meas}}{I_{pc}^{prop}(\lambda)}. \quad \text{(SI 5)}$$

Thus, $N_{phot}=\int_{\lambda_i}^{\lambda_f} EL(\lambda)'d\lambda$(SI 6). Repeating this procedure for all applied biases and substituting $N_{phot}$ into Eq. SI 1 gives voltage (or current-density)-dependent EQE, as plotted in FIG. 5*d*. Analogously, the 'true' emitted power is $$P_{EL} = \int_{\lambda_i}^{\lambda_f} EL(\lambda)' \cdot \frac{hc}{\lambda} d\lambda,$$

giving radiance as, $$L(V) = \frac{P_{EL}(V)}{A \cdot \Omega}, \quad \text{(SI 7)}$$

where A is the NC-LED pixel area. Again, this is evaluated for all applied biases, leading to FIG. 5*c*.

Eq. SI 1 indicates that EQE is subject to experimental measurement errors in $N_{phot}$, I and g, namely and $\sigma_{N_{phot}}$, $\sigma_i$ and $\sigma_g$, respectively. $\sigma_I$ results from Keithley 2636A equipment resolution and $\sigma_g$ from geometric errors in a and L in Eq. SI 2. From Eq. SI 6, $\sigma_{N_{phot}}$ in turn arises from errors in $I_{pc}^{meas}$ EL (π) and R(λ), namely $\sigma_{I_{pc}^{meas}}$, $\sigma_{EL}$ and $\sigma_R$, respectively. $\sigma_R$ results from Newport 818-IR photodiode calibration error whereas $\sigma_{I_{pc}^{meas}}$ is due to background noise recorded by the photodiode/Newport Multi-Function Optical Meter 1835-C measurement setup. $\sigma_{EL}$ is taken to be negligible. Total measurement errors, represented by black and green error bars in FIG. 5*d*, are calculated by combining $\sigma_{I_{pc}^{meas}}$, $\sigma_R$, $\sigma_I$ and $\sigma_g$ in quadrature, accounting for multiplication factors implicit in Eq. SI 1. Measurement errors for NC-LEDs based on all NC types are shown in FIG. 6, indicated by blue error bars.

Device-to-device EQE Variation

Figure 5:
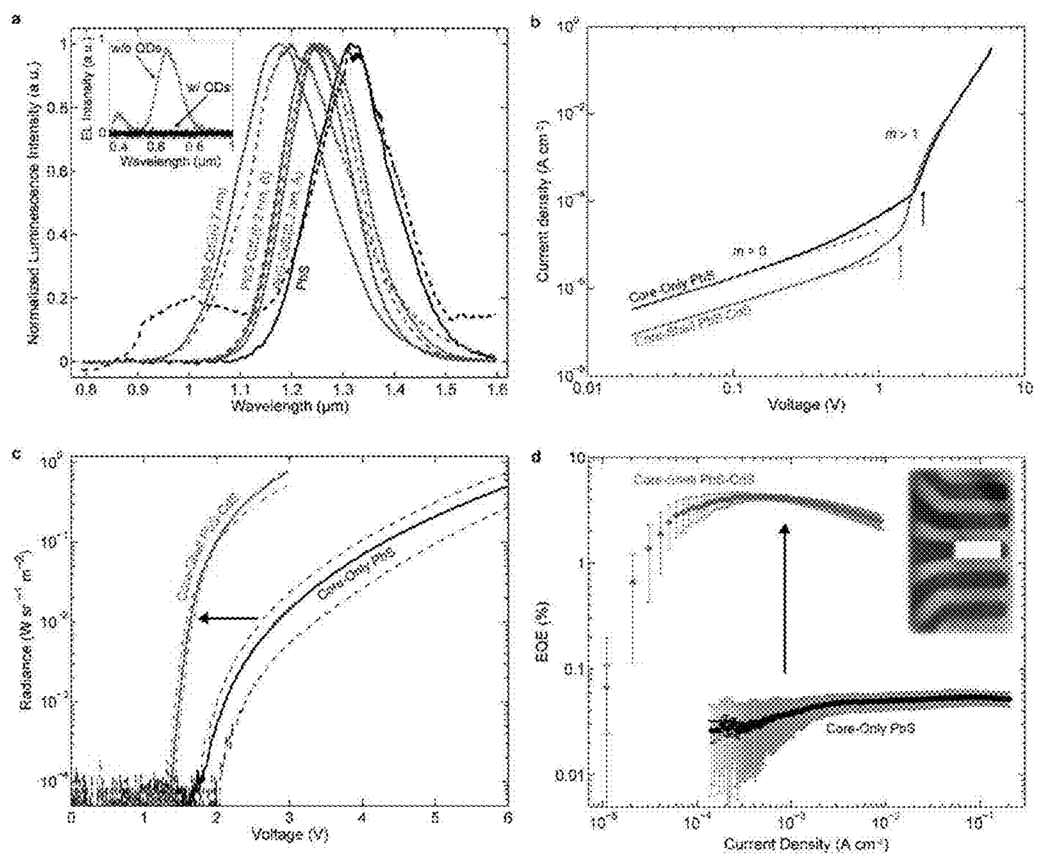
FIG. 5 shows NC-LED performance using core-only versus core-shell NCs.
Figure 6:
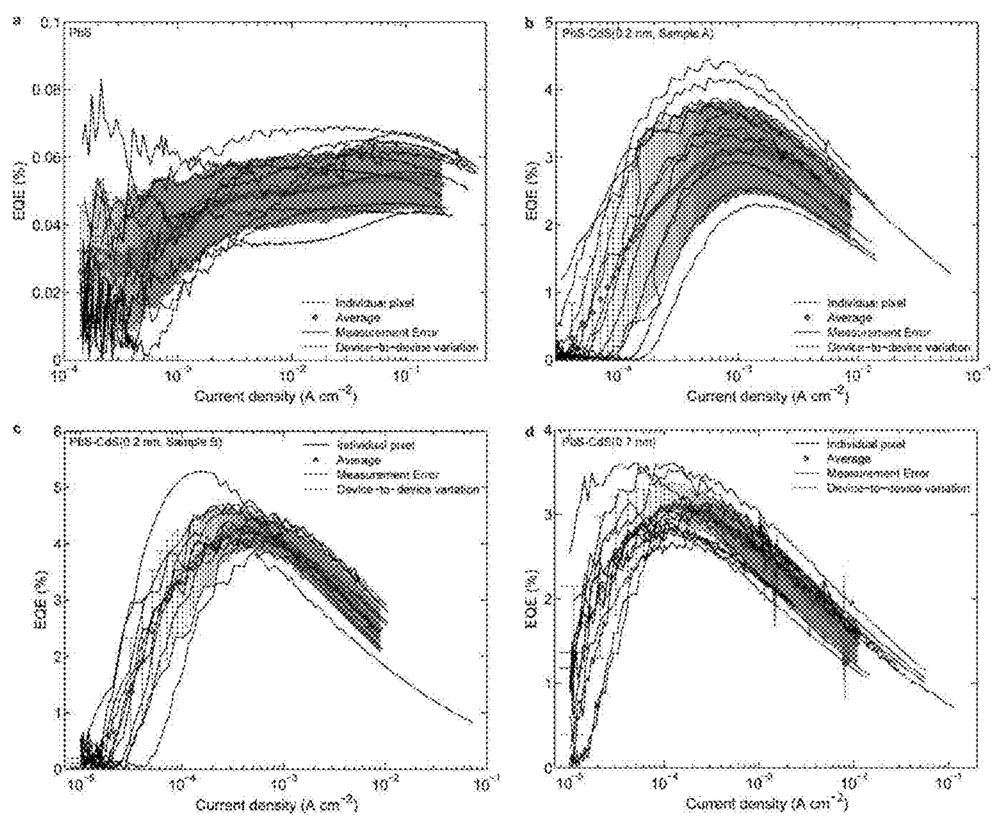
FIG. 6 shows raw EQE-current density data with measurement errors and device-to-device variations.

FIG. 6 shows raw EQE-current density data (from about three pixels per device, and from devices fabricated on two to five separate runs) for NC-LEDs based on all NC types. These device-to-device variations strictly arise due to systematic errors because they exceed the measurement errors calculated above. However, as a useful guide, device-to-device variations are approximated by the standard deviations of raw data from their mean, shown as grey error bars in FIG. 5*d*, FIG. 4*b* and FIG. 6. The EQE errors for the 'champion' NC-LEDs, indicated by grey error bars in FIG. 4*b*, represent the standard deviations in EQE of three to five pixels on single 'champion' devices.

Characterization of the NCs and the Light Emitting Device

Current density-voltage (J-V) characteristics are recorded in a nitrogen-filled glovebox using a computer-controlled Keithley 2636A current/voltage source meter. Simultaneously, front face EL power output through ITO is measured using a calibrated Newport 818-IR germanium photodiode and recorded with a computer-interfaced Newport Multi-Function Optical Meter 1835-C. The photodiode's active area is aligned with the emissive pixel and a diaphragm between the two prevents collection of waveguided EL from the glass substrate. Total radiated power (from which radiance-voltage (L-V) characteristics and power efficiency are obtained) is then calculated by assuming Lambertian emission and by accounting for the wavelength dependence (weighted by the device's EL spectrum) of the photodiode's responsivity. EQE is calculated as the ratio of the number of forward-emitted photons to the number of injected electrons, per unit time. Power conversion efficiency is defined as the radiated optical power divided by the input electrical power. For each NC type, L-J-V and EQE data are taken from about three pixels per device, and from devices fabricated on two to five separate runs; the only exceptions are the 'champion devices', for which data comes from three to five pixels on one 'champion' device. In all cases, variations between data for a given NC type are referred to as "device-to-device" variations in the text.

FIG. 5 shows NC-LED performance using core-only versus core-shell NCs. FIG. 5*a* shows normalized electroluminescence (solid, 3 V applied bias) and photoluminescence (dashed) spectra of NC-LEDs containing: (black) PbS; (red) PbS—CdS (0.2 nm, Sample A); (green) PbS—CdS (0.2 nm, Sample B); and (blue) PbS—CdS (0.7 nm) NCs. Inset: Normalized electroluminescence spectra of otherwise identical LEDs (with the structure shown in FIG. 1) with and without a film of NCs (8 V and 6 V applied biases, respectively). FIG. 5*b* shows average current density-voltage (J-V) behavior of: (black) core-only PbS; and (green) core-shell PbS—CdS (0.2 nm, Sample B) NC-LEDs. The dashed grey lines are fits to J $\propto V^{m+1}$, with m=0 and m>1 corresponding to Ohmic and trap-limited space-charge conduction regimes, respectively. The arrows indicate electroluminescence 'turn-on', which coincides with the upturn in slope of the J-V curves. FIG. 5*c* shows radiance-voltage characteristics of these devices. Solid lines represent average radiances and dotted lines correspond to minimum and maximum 'turn-on' voltages recorded for all measured devices. FIG. 5*d* shows external quantum efficiency-current density performance of these devices. Black and green error bars indicate experimental measurement errors while the standard deviation of device-to-device variations are shown in grey. Inset: photograph of an array of five NC-LEDs taken with an infrared camera, with the middle device turned on (active area of 1.21 $mm^2$) and emitting at a centre wavelength of λ=1242 nm.

FIG. 5*a* presents EL spectra for these PbS and PbS—CdS NC-LEDs. Their overall agreement with corresponding PL spectra from the same locations confirms pure NIR NC EL at a wavelength of ~1.2 μm. In the absence of a NC layer, high voltages (>4 V) induce low-intensity visible EL characterized by two peaks at λ=400 nm and λ=670 nm (see FIG. 5*a*, Inset), resulting from CBP and/or ZnO emission. However, upon addition of a NC layer, this parasitic emission is entirely suppressed, indicative of efficient carrier recombination solely within the NCs. FIG. 5*a* shows that a blue-shift in EL and PL of more than 100 nm is achieved by adding a 0.7 nm CdS shell to core-only PbS. This is indicative of increased exciton confinement due to a reduction in core size during cation-exchange. By fabricating similar devices with other batches of PbS and with thicker CdS shells, EL peaks can be tuned from PbS—CdS NCs between λ=1163 nm and λ=1341 nm. NIR EL and current-dependent brightness is visualized with an infrared camera (FIG. 5*d*, Inset.

Figure 4:
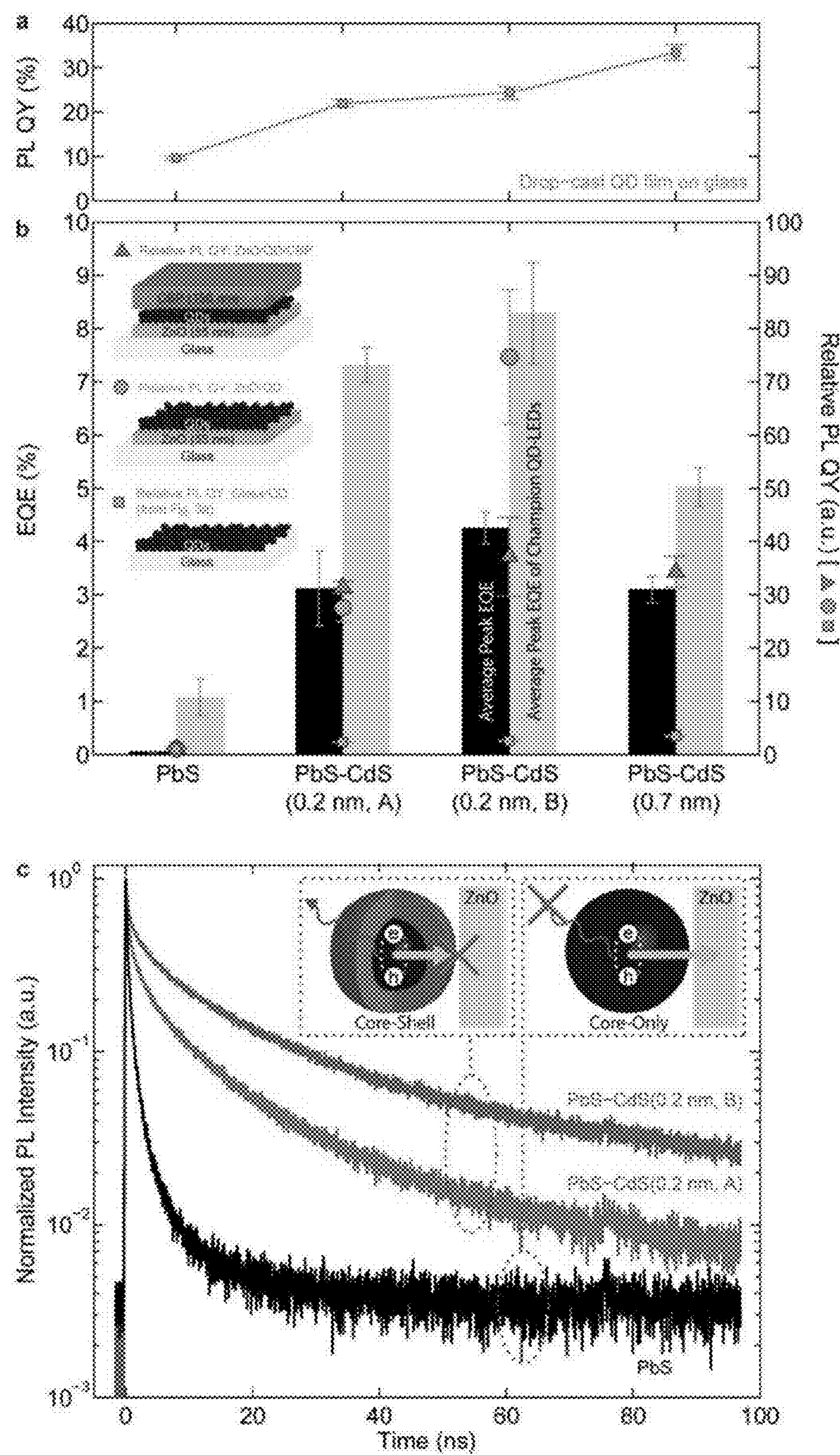
FIG. 4 shows correlation of NC-LED EQE with NC PL quantum yields.

FIG. 4 shows correlation of NC-LED EQE with NC PL quantum yields. FIG. 4*a* shows absolute photoluminescence quantum yields (PL QYs) of drop-cast films of core-only (PbS) and core-shell (PbS—CdS) NCs on glass as a function of shell thickness, measured using an integrating sphere (described in the Methods section). Cation-exchange serves as a facile post-synthesis approach to increasing $\eta_{PL}$ of NIR-emitting NCs to unprecedented values ($\eta_{PL}$=33% in thin-film for a 0.7 nm shell). Error bars show standard deviations of the values measured at four locations per sample. FIG. 4*b* shows corresponding dependence of NC-LED average peak EQE on NC shell thickness is indicated by black columns. These EQEs correlate well with average relative in situ $\eta_{PL}$ of spin-cast films of these NCs ($\eta_{PL}$ of core-only NCs is normalized to unity) in: (green spots) glass/ZnO/NC; and (orange triangles) glass/ZnO/NC/CBP optical structures, depicted schematically in the inset. In contrast, relative intrinsic NC $\eta_{PL}$ (blue squares), taken from 4*a*, greatly underestimate the EQE enhancements. Average peak EQEs obtained from a 'champion' set of devices are shown as grey columns. The EQE error bars for the main devices (black columns) and the 'champion' devices (grey columns) indicate device-to-device variations. The NC $\eta_{PL}$ error bars show standard deviations between values measured at roughly five locations per sample. FIG. 4*c* shows normalized time-dependent PL intensity of spin-cast films of: (black) PbS; (red) PbS—CdS (0.2 nm, Sample A); and (green) PbS—CdS (0.2 nm, Sample B) NCs, all on ZnO. Inset: Illustrations depicting the passivation of ZnO-induced PbS PL quenching (blue arrow) by CdS shells.

The effect of shell growth on NIR NC-LED performance is shown in FIGS. 5*b-d*, which compare core-only PbS NCs with PbS—CdS (0.2 nm, Sample B) NCs. Results for the other core-shell NCs are summarized in FIG. 4*b* and in FIG. 6 to FIG. 9. FIG. 6 shows raw EQE-current density data with measurement errors and device-to-device variations. In FIG. 6, EQEs of individual NC-LED pixels use: a, PbS; b, PbS—CdS (0.2 nm, Sample A); c, PbS—CdS (0.2 nm, Sample B); and d, PbS—CdS (0.7 nm). NCs are indicated by black lines, with blue dots showing their averages. Measurement errors and device-to-device variations are represented by blue and grey error bars, respectively.

Figure 7:
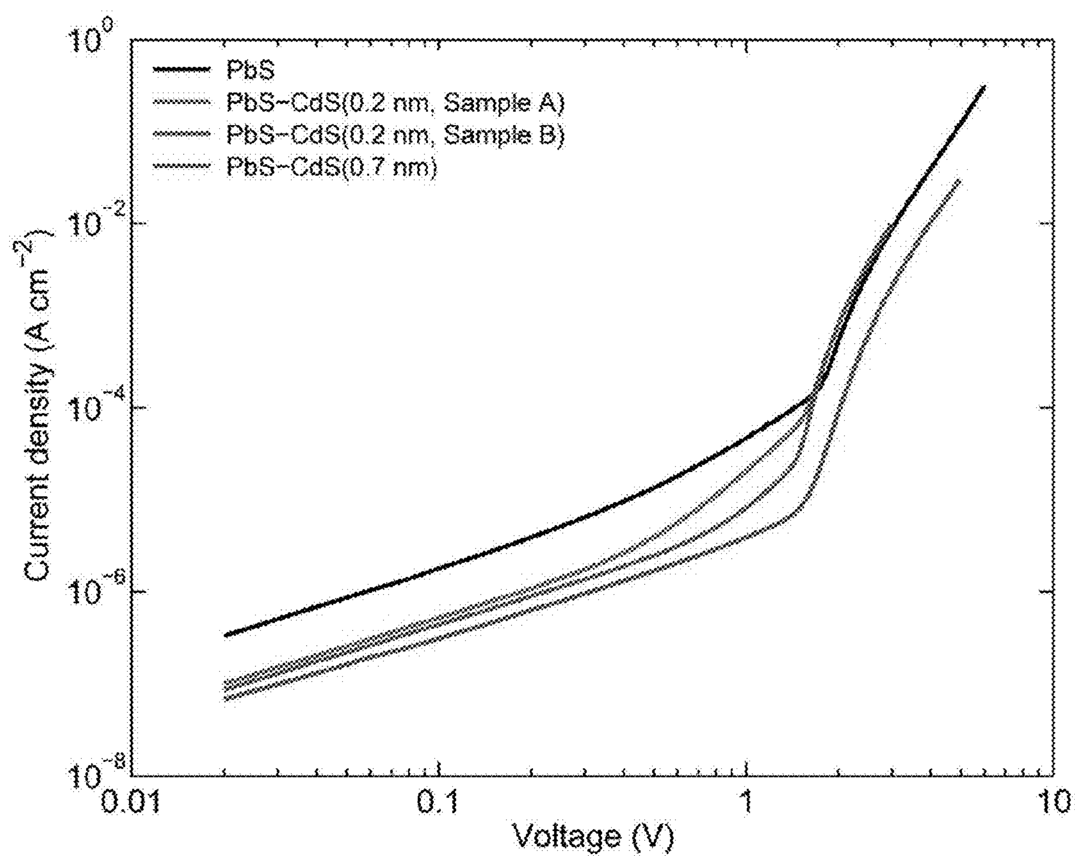
FIG. 7 shows current density-voltage behavior.

FIG. 7 shows current density-voltage behavior. In FIG. 7, average performance of NC-LEDs is based on: (black) PbS; (red) PbS—CdS (0.2 nm, Sample A); (green) PbS—CdS (0.2 nm, Sample B); and (blue) PbS—CdS (0.7 nm) NCs.

Figure 8:
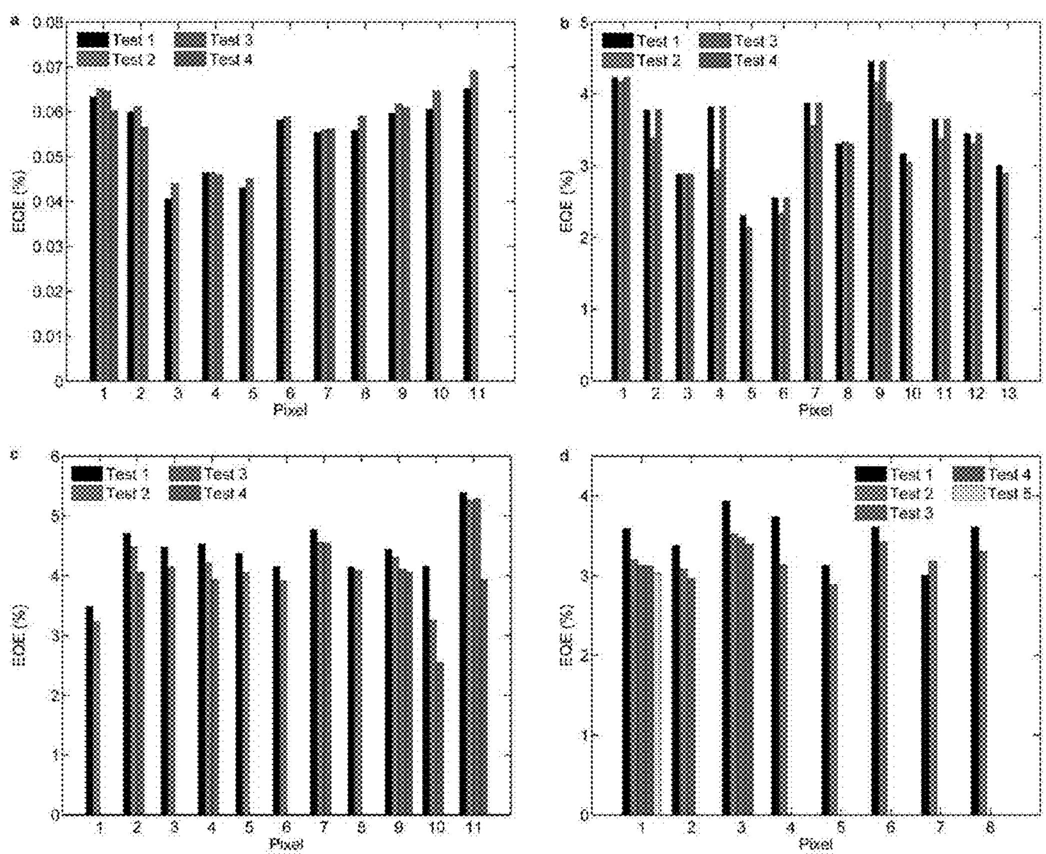
FIG. 8 shows test-to-test and pixel-to-pixel variations in peak EQE.

FIG. 8 shows test-to-test variations in peak EQE. In FIG. 8, peak EQEs of individual NC-LED pixels (arbitrarily numbered) tested multiple times use: a, PbS; b, PbS—CdS (0.2 nm, Sample A); c, PbS—CdS (0.2 nm, Sample B); and d, PbS—CdS (0.7 nm) NCs. Peak EQEs are shown after multiple test cycles: (black) Test 1; (red) Test 2; (green) Test 3; (blue) Test 4; and (turquoise) Test 5. Successive test cycles yield peak EQE values between 84% and 104% of the initial values for all pixels and all NC types.

Figure 9:
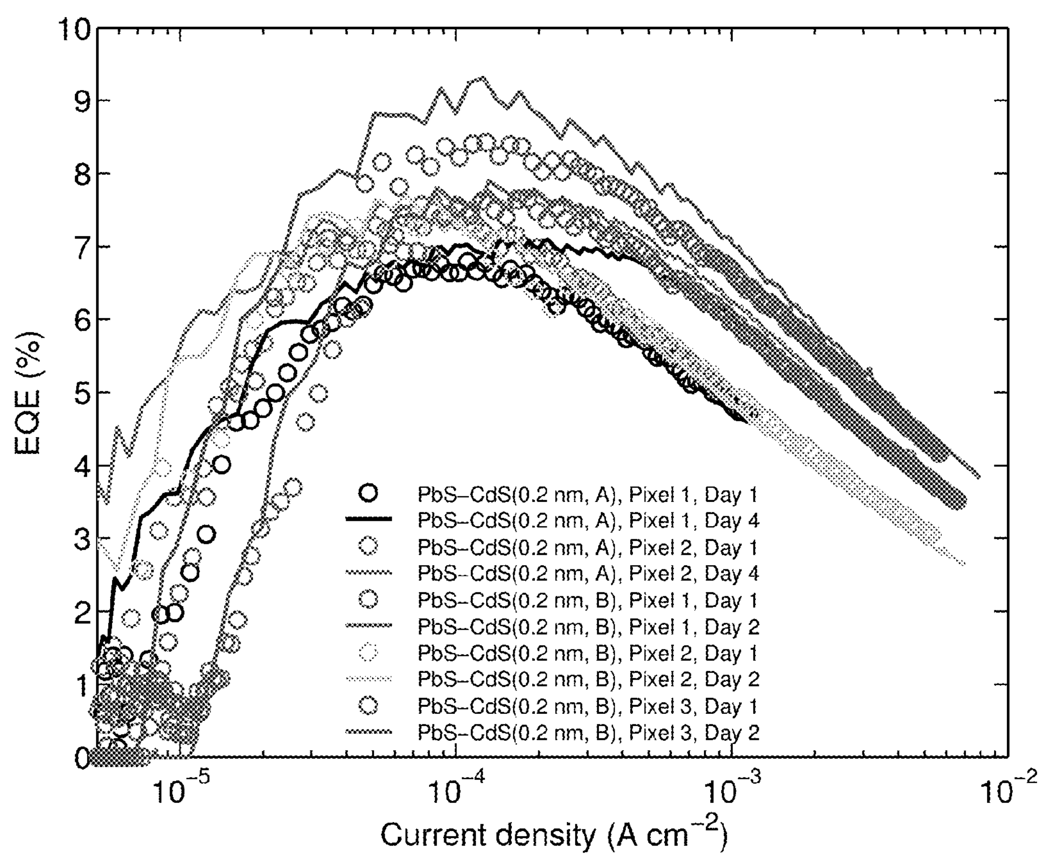
FIG. 9 shows day-to-day variations in raw EQE-current density data.

FIG. 9 shows Day-to-day variations in raw EQE-current density data. In FIG. 9, EQEs are for: (black and red) two pixels of PbS—CdS (0.2 nm, Sample A) NCs; and for (dark green, light green, blue) three pixels of PbS—CdS (0.2 nm, Sample B) NCs (all 'champion' devices). For each pixel, data was recorded one day after fabrication (Day 1, open circles) and again (solid lines) either two (Day 2) or four (Day 4) days after fabrication. We see that EQE either remains unchanged or increases slightly over the course of at least a few days.

Figure 10:
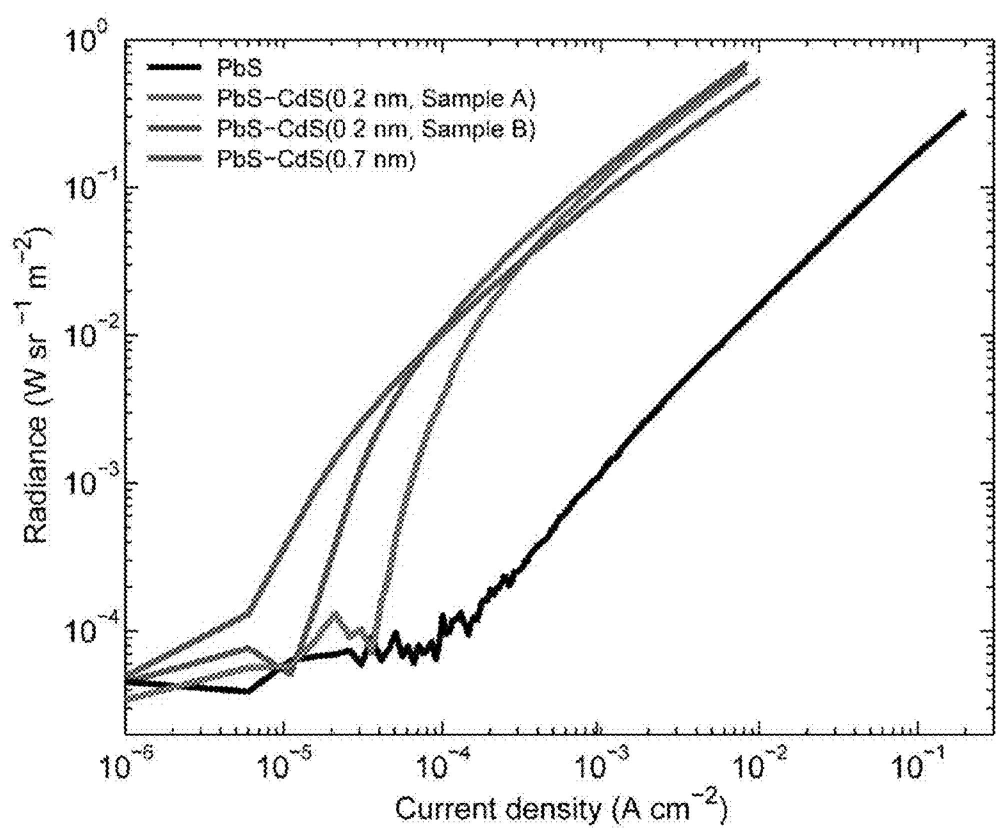
FIG. 10 shows radiance-current density characteristics.

FIG. 5*b* shows that the current density-voltage (J-V) behavior for both core-only and overcoated NCs is described by J $\propto V^{m+1}$, a signature of trap-limited space-charge conduction. See, for example, Hikmet, R. a. M. et al., *Journal of Applied Physics* 93, 3509 (2003), which is incorporated by reference in its entirety. The corresponding radiance-voltage (L-V) plot (FIG. 5*c*) shows that replacing the PbS NCs with PbS—CdS (0.2 nm, Sample B) NCs results in a reduction in 'turn-on' voltage (measured at $3\times10^{-4}$ W $sr^{-1}$ $m^{-2}$) from 2.0±0.1 V to 1.4±0.1 V. This may be due to more efficient NC charge injection, suggested by the simultaneous reduction in 'turn-on' current density of more than an order of magnitude with increasing shell thickness (FIG. 10). FIG. 10 shows radiance-current density characteristics. In FIG. 10, average radiance for NC-LEDs is based on: (black) PbS; (red) PbS—CdS (0.2 nm, Sample A); (green) PbS—CdS (0.2 nm, Sample B); and (blue) PbS—CdS (0.7 nm) NCs. Upon shell growth, 'turn-on' current densities (measured at $3\times10^{-4}$ W $sr^{-1}$ $m^{-2}$) are reduced by 8, 16 and 31 times for PbS—CdS (0.2 nm, Sample A), PbS—CdS (0.2 nm, Sample B), and PbS—CdS (0.7 nm) NCs, respectively. For any given current density above core-only NC-LED 'turn-on', the radiance of the core-shell NC-LEDs is between 35 and 150 times higher than that of the core-only NC-LEDs.

Taken together, the J-V and L-V data yield an average peak power conversion efficiency of 2.4%; more than double that of any previous λ>1 μm NIR NC-LED (Table 1).

Table 1 shows summary of previously reported NC-LED peak external quantum efficiencies and power efficiencies. Peak performance metrics for a number of reported near-infrared NC-LEDs are tabulated in chronological order. All peak external quantum efficiencies (EQEs) are quoted directly from the references. Unless provided, peak power efficiencies are approximated by computing ($P_{EL}$/IV)×100% as a function of I or V. Here, $P_{EL}$ is maximum emitted power, which, unless given, is approximated by extracting plotted data (Plot Digitizer) and computing $P_{EL}=(I \cdot EQE \cdot hc)/(|e| \cdot \lambda)$ (where λ is peak emission wavelength) as a function of I or V so as to find its maximum. Dashes (-) indicate unknown values not calculable by these methods. Note that λ>1 μm for all references except Cheng et al.

TABLE 1

| Reference | Year | Peak EQE (%) | Peak Power Conversion Efficiency (%) |
|---|---|---|---|
| Tessler et al.[1] | 2000 | 0.5 | 0.02 |
| Steckel et al.[2] | 2003 | 0.001 | <0.1 |
| Koktysh et al.[3] | 2004 | <0.001 | — |
| Konstantatos et al.[4] | 2005 | 0.27 | 0.01 |
| O'Conner et al.[5] | 2005 | 0.02 | $1.2 \times 10^{-4}$ |
| Bourdakos et al.[6] | 2008 | 1.15 | 0.66 |
| Choudhury et al.[7] | 2010 | 0.83 | 0.08 |
| Cheng et al.[8] (λ < 1 μm) | 2011 | 6.7 (3 nm NCs); 8.6 (5 nm NCs) | 0.4 (3 nm NCs); 8 (5 nm NCs) |
| Sun et al.[9] | 2012 | 2.0 | 1.0 |
| Ma et al.[10] | 2012 | 0.72 | 0.11 |
| This work | 2013 | 4.3 | 2.4 |

See, for example,
[1]Tessler, N. et al., *Science* 295, 1506-8 (2002);
[2]Steckel, J. S. et al., *Advanced Materials* 15, 1862-1866 (2003);
[3]Koktysh, D. S. et al., *ChemPhysChem* 5, 1435-8 (2004);
[4]Konstantatos, G. et al., *Advanced Functional Materials* 15, 1865-1869 (2005);
[5]O'Connor, E. et al., *Applied Physics Letters* 86, 201114 (2005);
[6]Bourdakos, K. N. et al., *Applied Physics Letters* 92, 153311 (2008);
[7]Choudhury, K. R. et al., *Organic Electronics* 11, 23-28 (2010);
[8]Cheng, K.-Y. et al., *Nano Letters* 11, 1952-6 (2011);
[9]Sun, L. et al., *Nature Nanotechnology* 7, 369-373 (2012);
[10]Ma, X. et al., *Organic Electronics* 13, 525-531 (2012), each of which is incorporated by reference in its entirety.

Figure 2:
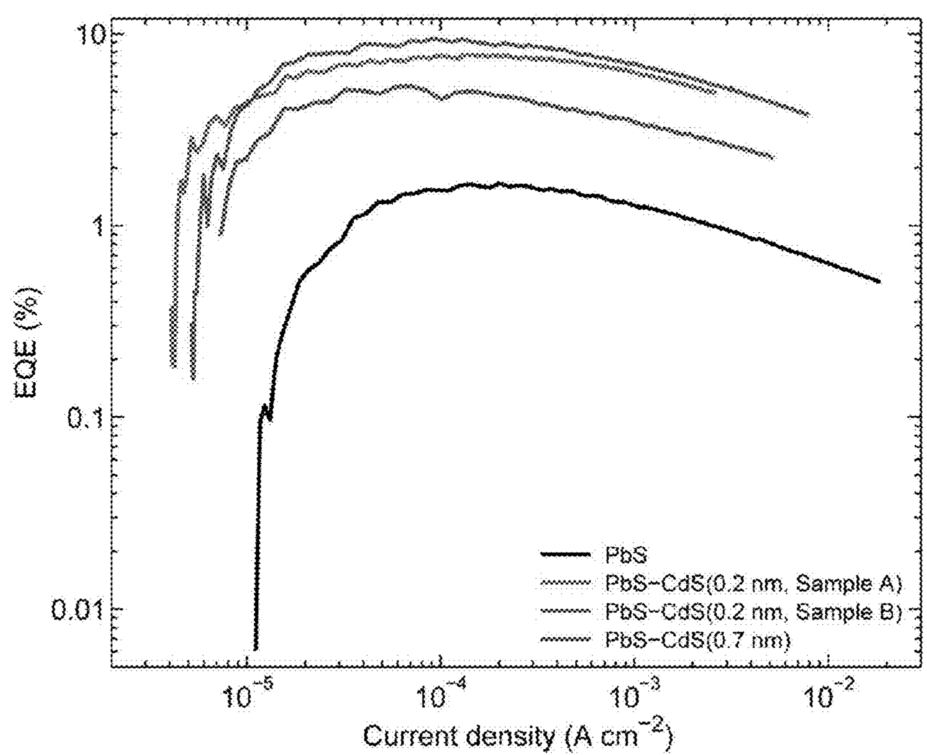
FIG. 2 shows EQE-current density characteristics of anomalous 'champion' NC-LEDs. Record performance curves for one set of NC-LEDs using: (black) PbS; (red) PbS—CdS (0.2 nm, Sample A); (green) PbS—CdS (0.2 nm, Sample B); and (blue) PbS—CdS (0.7 nm) NCs. Peak EQEs are 1.7%, 7.7%, 9.4% and 5.3%, respectively, as plotted in FIG. 4*b*.
Figure 11:
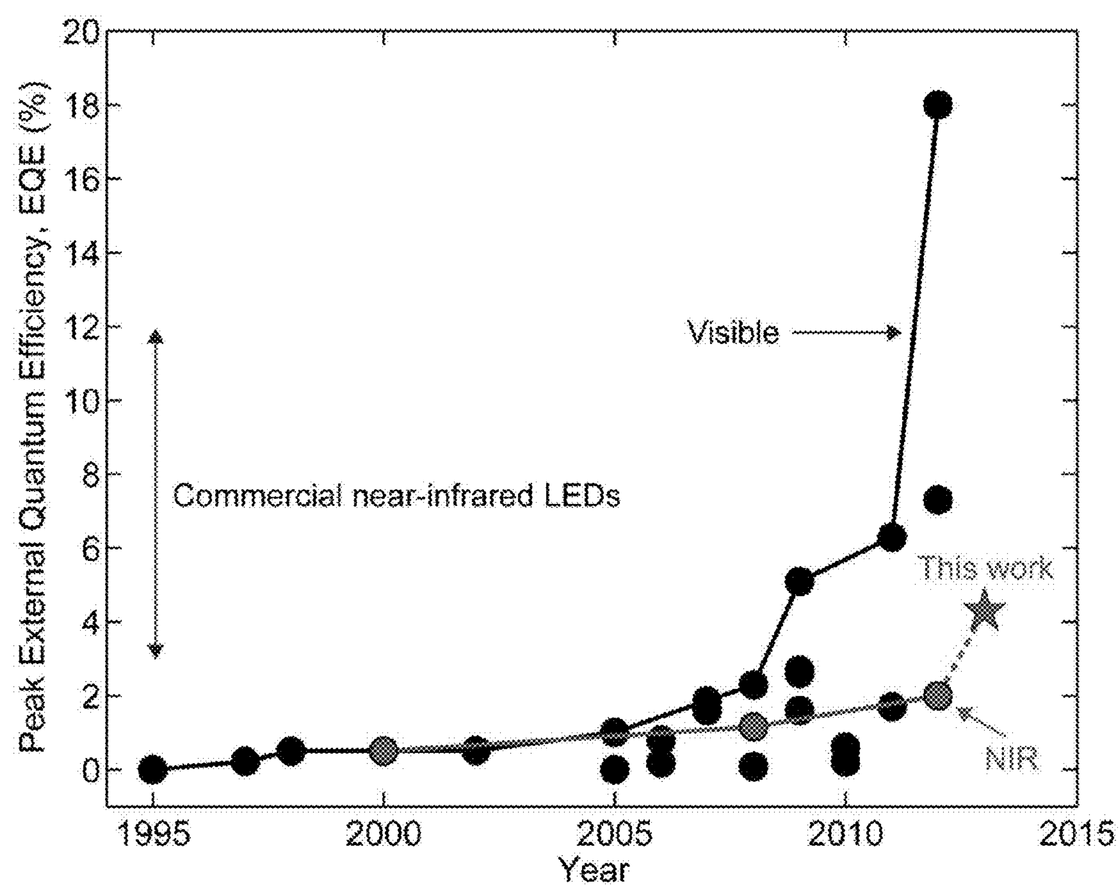
FIG. 11 shows progression over time of peak EQEs of visible-emitting and near-infrared NC-LEDs, and comparison with this work and with commercial near-infrared LEDs.
Figure 12:
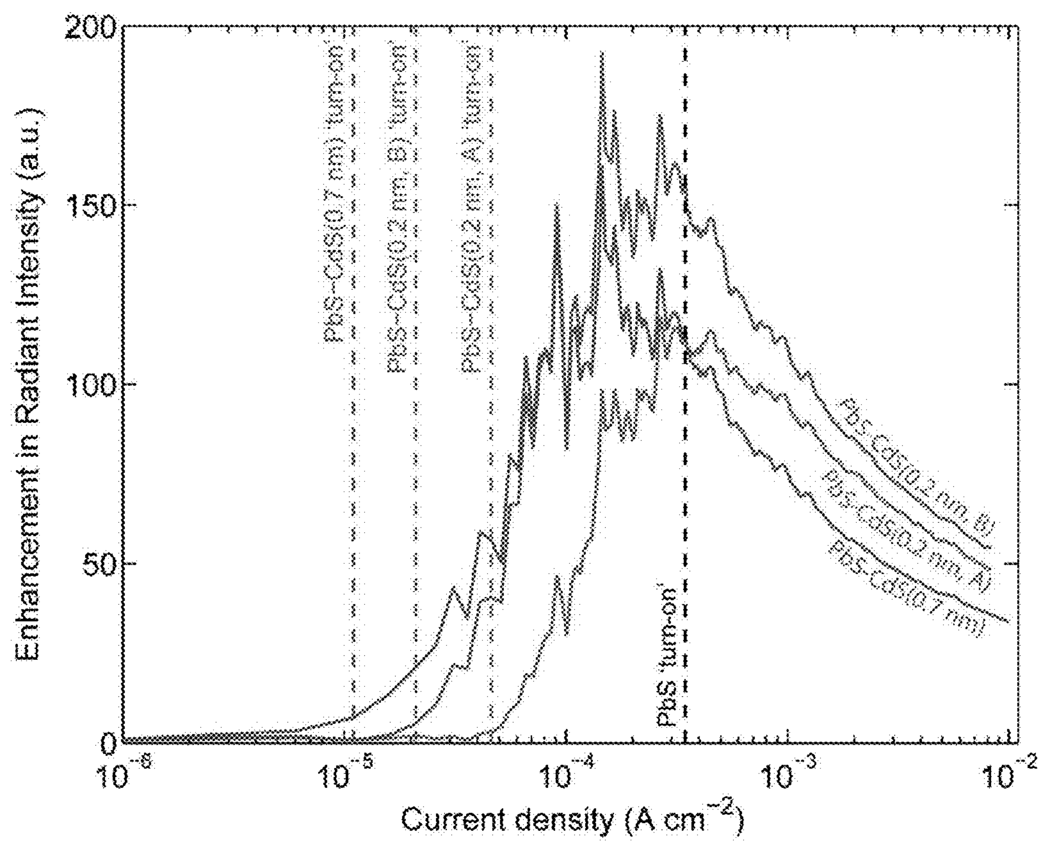
FIG. 12 shows enhancement in radiant intensity efficiency. The enhancement in radiant intensity efficiency (radiant intensity per amp) compared with that of the control core-only PbS NC-LED is shown as a function of current density for NC-LEDs using: (red) PbS—CdS (0.2 nm, Sample A); (green) PbS—CdS (0.2 nm, Sample B); and (blue) PbS—CdS (0.7 nm) NCs. 'Turn-on' current densities are indicated by dashed lines. Once the core-only PbS NC-LED (black dashed line) has turned on, the enhancement is between 35 and 150 times for all core-shell devices.

EQE-current density data is shown in FIG. 5*d*. Core-shell PbS—CdS (0.2 nm, Sample B) NC-LEDs exhibit average peak EQEs of 4.3±0.3%. This surpasses that of previously reported λ>1 μm NIR NC-LEDs (Table 1 and FIG. 11). FIG. 11 shows progression over time of peak EQEs of visible-emitting and near-infrared NC-LEDs, and comparison with this work and with commercial near-infrared LEDs. Visible-emitting NC-LED peak EQEs (a substantial but non-exhaustive selection from the literature, reproduced from Shirasaki) are represented by filled black circles. Peak EQEs of near-infrared (NIR) NC-LEDs, represented by filled green circles, are taken from Table 1 above. See, for example, Shirasaki, Y. et al., *Nature Photonics* 7, 13-23 (2013), which is incorporated by reference in its entirety. Solid lines connect new record values. The 4.3% average peak EQE of the core-shell NIR NC-LEDs reported here is shown by a green star. The range of EQEs of typical commercially-available NIR LEDs is also indicated. This EQE is also commensurate with typical commercial NIR LEDs (3% to 12%), though at significantly lower emission powers. In comparison, the average peak EQE of control core-only PbS NC-LEDs is approximately 50 to 100 times lower: 0.05±0.01%; consistent with the performance of NC-LEDs previously reported using core-only PbS with similar long-chain carboxylic acid ligands. As shown in FIG. 4*b* (black columns), EQE is sizably enhanced for all core-shell NCs investigated. A direct consequence of this is that radiant intensity efficiencies (radiant intensity per amp) are increased at all current densities above 'turn-on' by between 35 and 150 times by switching from core-only to core-shell NCs (FIGS. 8 and 12). The grey columns in FIG. 4*b* represent the average peak EQEs observed from an anomalous (not included in any averaged performance data) 'champion' set of devices: up to 8.3±1.0% for PbS—CdS (0.2 nm, Sample B) NC-LEDs (FIG. 2). Repeated measurements of these 'champion' devices manifested persistently stable operation, suggesting that NIR NC-LEDs with EQE >10% may be within reach.

Since the EQE of a NC-LED is proportional to $\eta_{PL}$ of its emitting NCs, the dramatic increase in EQE that comes from replacing core-only NCs with core-shell NCs can be better understood by quantifying the correlation between changes in EQE and in $\eta_{PL}$ of the NCs in the devices. Even at zero-bias, $\eta_{PL}$ can be subject to in situ PL quenching mechanisms such as exciton energy transfer to conductive charge-transport layers (CTLs), exciton dissociation at CTL/NC interfaces and Auger recombination. See, for example, Caruge, J. M. et al., *Nature Photonics* 2, 247-250 (2008); Jha, P. P. et al., *The Journal of Physical Chemistry C* 114, 21138-21141 (2010); Change, R. R. et al., *Advances in Chemical Physics Vol.* 37, 1-65 (1978); Brown, P. R. et al., *Nano Letters* 11, 2955-61 (2011); Wise, F. W. et al., *ACS Nano* 2, 2206-2212 (2008); Tvrdy, K. et al., *Proceedings of the National Academy of Sciences of the United States of America* 108, 29-34 (2011); Song, N. et al., *ACS Nano* 7, 1599-1608 (2013), each of which is incorporated by reference in its entirety.

Figure 13:
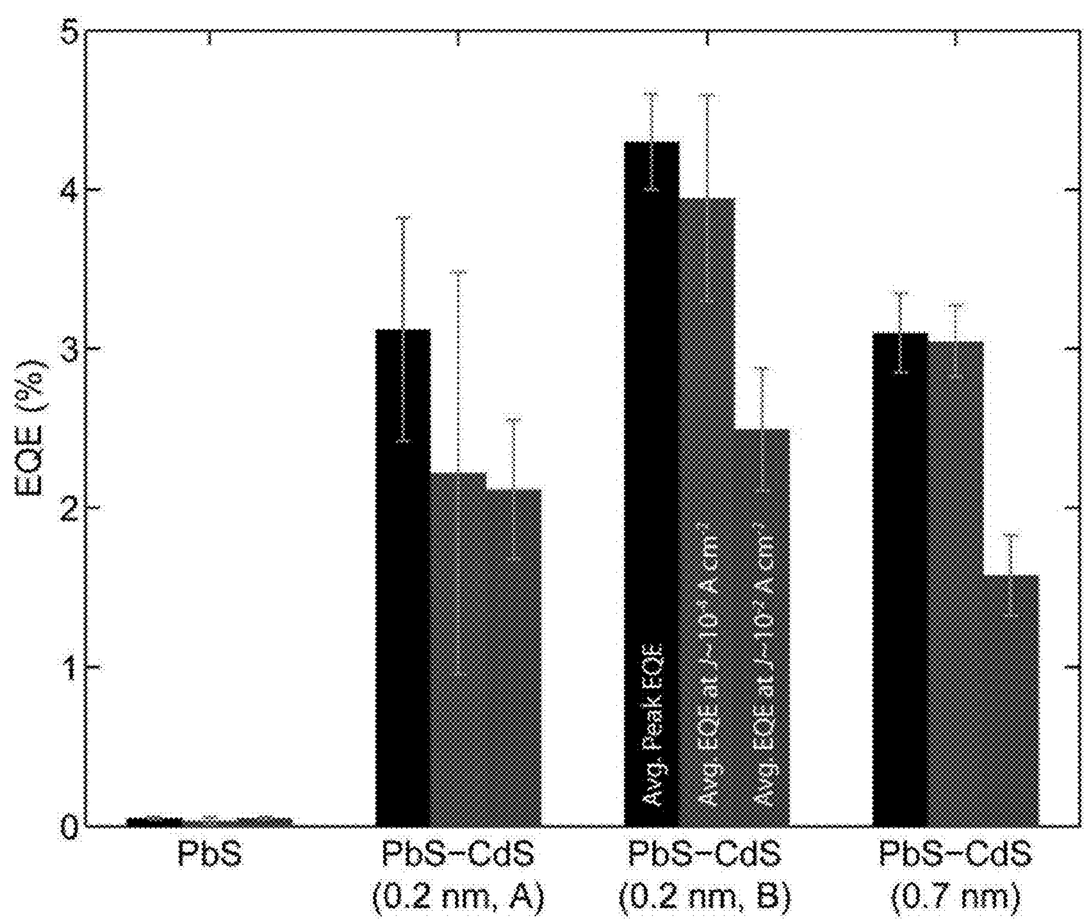
FIG. 13 shows dependence of NC-LED EQE-shell thickness correlation on current density. Average EQE data measured at current densities of ~$10^{-4}$ A $cm^{-2}$ and ~$10^{-2}$ A $cm^{-2}$, extracted from FIG. 6, are represented by green and blue columns, respectively, and compared with the average peak EQE data (black columns) shown in FIG. 4*b*. The error bars indicate device-to-device variations in EQE. For all data sets a similar correlation with shell-thickness is reproduced.

Relative $\eta_{PL}$ of each type of NC was measured in glass/ZnO/NC/CBP and glass/ZnO/NC structures (FIG. 4*b*, Inset) that replicate the NCs' in situ environment in the NC-LEDs. Relative $\eta_{PL}$ is quantified by comparing the integrated areas under the steady-state PL spectra of the NCs in these structures. The results for each type of NC are shown in FIG. 4*b* relative to $\eta_{PL}$ of core-only PbS, which has been normalized to unity. Whereas shell growth produces only a three-fold rise in $\eta_{PL}$ of NC-only (glass/NC) samples (blue in FIG. 4*a* and FIG. 4*b*), relative $\eta_{PL}$ of these NCs in situ (orange and green in FIG. 4*b*) increases by 30 to 100 times, indicating that the CdS shell significantly passivates PbS NCs against in situ non-radiative pathways. The similarity of the results for test structures with and without CBP (orange versus green in FIG. 4*b*) implies that ZnO is mostly responsible for the PL quenching. The generally good agreement between relative in situ $\eta_{PL}$ and average peak EQE (black columns) indicates that the shell-induced increases in $\eta_{PL}$ predominantly explain the efficiency enhancements achieved. This is further substantiated by the reproducibility of this correlation for EQE data corresponding to all measured current densities; examples at ~$10^{-4}$ A cm$^{-2}$ and ~$10^{-2}$ A cm$^{-2}$ are shown in FIG. 13.

Figure 14:
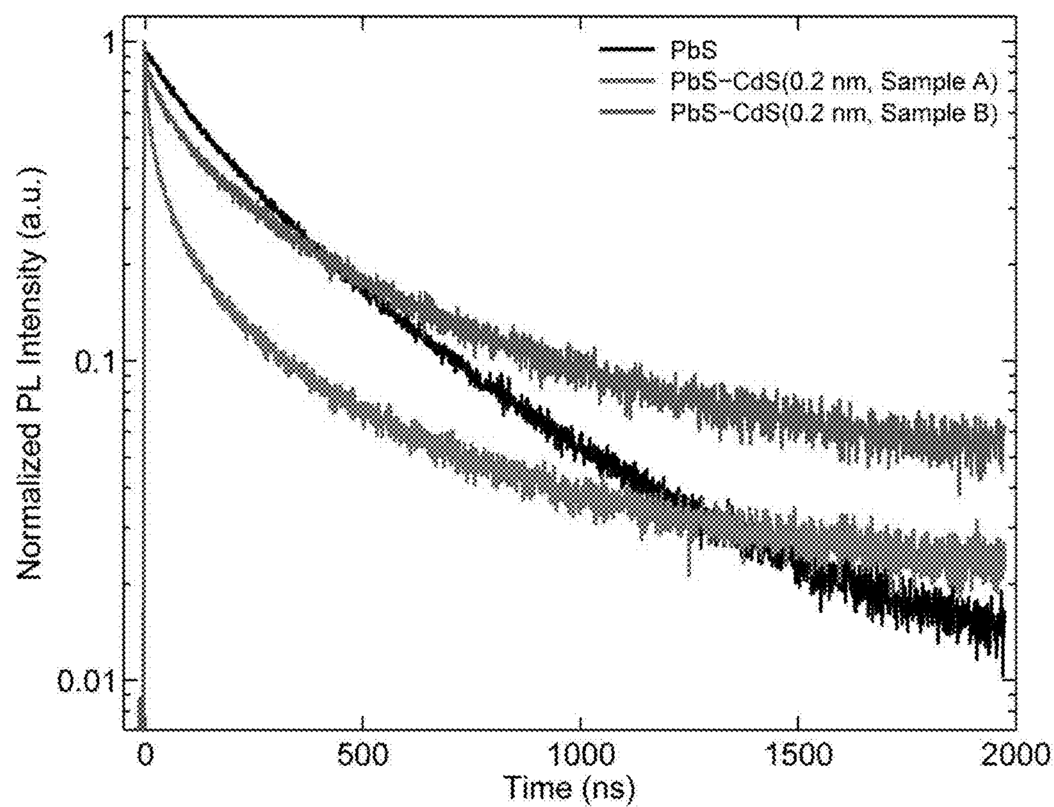
FIG. 14 shows transient photoluminescence of NCs on glass. Normalized time-dependent PL intensity of spin-cast films of: (black) PbS; (red) PbS—CdS (0.2 nm, Sample A); and (green) PbS—CdS (0.2 nm, Sample B) NCs, all on glass.

Time-resolved PL spectroscopy offers further insights into the shell-dependent NC PL quenching by ZnO. FIG. 4*c* shows the normalized transient NC PL decay curves for the glass/ZnO/NC samples. Compared with glass/NC samples (FIG. 14), PL lifetimes are reduced for all of the NC types in the presence of ZnO, indicative of PL quenching; similar changes have previously been seen for PbS NCs with other metal oxides. See, for example, Leventis, H. C. et al., *Journal of the American Chemical Society* 132, 2743-50 (2010), which is incorporated by reference in its entirety. The longer PL lifetimes of core-shell versus core-only NCs (Table 2) corroborate the conclusion that the former are more effective at mitigating PL quenching. See, for example, Fisher, B. R. et al., *Journal of Physical Chemistry B* 108, 143-148 (2004), which is incorporated by reference in its entirety.

Table 2 shows PL lifetimes and relative PL quantum yields of spin-cast films of core-only (PbS) and core-shell (PbS—CdS) NCs on ZnO, calculated from FIG. 4*c*, $\tau_e$−1 and $\tau_e$−2 are the times at which NC PL intensity, I, has decreased from its initial value of $I_0$ to $I=I_0/e$ and $I=I_0/e^2$, respectively.

TABLE 2

| | PbS | PbS—CdS(0.2 nm, A) | PbS—CdS(0.2 nm, B) |
|---|---|---|---|
| $\tau_e$-1 (ns) | 0.4 | 1.2 | 3.6 |
| $\tau_e$-2 (ns) | 1.1 | 8.8 | 17.6 |

It raises the question of what specific mechanisms, symbolized by the blue arrow in the inset of FIG. 4*c*, underpin the ZnO-induced NC PL quenching in the devices. Non-radiative energy transfer from visibly-coloured NCs to surface plasmon modes in conductive metal oxide CTLs of NC-LEDs has previously been postulated, but is unlikely here given the low carrier density of the undoped ZnO. See, for example, Jun Mei, M. et al., *Physical Review B* 79, 235205 (2009); Buonsanti, R. et al., *Nano Letters* 11, 4706-10 (2011), each of which is incorporated by reference in its entirety. Indeed in general, energy transfer from PbS NCs to ZnO—for example, to ZnO mid-gap states—seems at odds with the very low extinction coefficients reported for sol-gel ZnO in the NIR. See, for example, Znaidi, L. et al., 19*th European Photovoltaic Solar Energy Conference* 49, 301-304 (2004), which is incorporated by reference in its entirety. Alternatively, electron transfer from PbS NCs to ZnO, which is widely observed in photovoltaics, can be responsible. As has been noted in the context of CdSe—CdS NC quenching by ZnO nanocrystals, however, the energetic favourability of the ZnO/NC dissociative interface for electron transfer is expected to be voltage-dependent (forward biasing mitigates electron transfer) whereas the ZnO-induced PL quenching observed is, at least in order-of-magnitude, voltage-independent (FIG. 13). Hole transfer to ZnO mid-gap states is therefore more plausible, yet the challenge in reconciling either energy or charge transfer models with the extremely short length scales on which PL quenching occurs (~0.2 nm of CdS shell) points to a second possibility; quenching by defect states arising from the oxidation of PbS NCs by ZnO.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope or the invention. In addition, from the foregoing it will be seen that this invention is one well adapted to attain all the ends and objects set forth above, together with other advantages. It will be understood that certain features and sub-combinations are of utility and may be employed without reference to other features and sub-combinations. This is contemplated and within the scope of the appended claims. All such similar substitutes and modifications apparent to those skilled in the art are deemed to be within the spirit and scope of the invention as defined by the appended claims.

What is claimed is:

1. A near-infrared light emitting device, comprising:

a first electrode, a second electrode, a single light-emitting layer consisting essentially of a plurality of a single type of semiconductor nanocrystals disposed between the first electrode and the second electrode, wherein the plurality of semiconductor nanocrystals emit at wavelengths beyond 1 μm, wherein the plurality of semiconductor nanocrystals includes a core including PbS, PbSe, or PbTe, or a mixture thereof, wherein the core includes an overcoating on a surface of the core, the overcoating including a semiconductor material having a composition different from the composition of the core, wherein the overcoating includes CdS, CdSe, CdTe, ZnS, ZnSe, or ZnTe, or a mixture thereof wherein the device has a peak external quantum efficiency of at least 2% and wherein the plurality of semiconductor nanocrystals emit at wavelengths beyond 1 μm.

2. The near-infrared light emitting device of claim 1, wherein the plurality of semiconductor nanocrystals emit between 1100 nm and 1400 nm.

3. The near-infrared light emitting device of claim 1, wherein the core includes PbS.

4. The near-infrared light emitting device of claim 1, wherein the overcoating includes CdS.

5. The near-infrared light emitting device of claim 1, wherein the plurality of semiconductor nanocrystals that includes an overcoating reduces quenching from a metal oxide in an adjacent layer of the plurality of semiconductor nanocrystals.

6. The near-infrared light emitting device of claim 1, further comprising an electron-transport layer.

7. The near-infrared light emitting device of claim 1, further comprising a hole-transport layer.

8. The near-infrared light emitting device of claim 1, wherein an adjacent layer of the plurality of semiconductor nanocrystals includes a metal oxide.

9. The near-infrared light emitting device of claim 1, wherein the device has a peak external quantum efficiency of at least 4%.

10. The near-infrared light emitting device of claim 1, wherein the device has an average peak power conversion efficiency of at least 1%.

11. The near-infrared light emitting device of claim 1, wherein the device has an average peak power conversion efficiency of at least 2%.

* * * * *